United States Patent
Maejima

(10) Patent No.: US 7,852,676 B2
(45) Date of Patent: Dec. 14, 2010

(54) THREE DIMENSIONAL STACKED NONVOLATILE SEMICONDUCTOR MEMORY

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 12/407,494

(22) Filed: Mar. 19, 2009

(65) Prior Publication Data

US 2009/0268524 A1 Oct. 29, 2009

(30) Foreign Application Priority Data

Apr. 23, 2008 (JP) .............................. 2008-112660

(51) Int. Cl.
*G11C 16/04* (2006.01)
(52) U.S. Cl. ............................ 365/185.11; 365/185.23; 365/185.25
(58) Field of Classification Search ............ 365/185.11, 365/185.23, 185.24, 185.25, 185.05, 185.18, 365/51
See application file for complete search history.

(56) References Cited

U.S. PATENT DOCUMENTS

| | | | |
|---|---|---|---|
| 7,091,890 B1 * | 8/2006 | Sasaki et al. ................ | 341/100 |
| 2009/0010071 A1 * | 1/2009 | Lee ........................ | 365/185.22 |
| 2009/0268522 A1 * | 10/2009 | Maejima ................. | 365/185.11 |
| 2009/0268523 A1 * | 10/2009 | Maejima ................. | 365/185.11 |
| 2010/0097858 A1 * | 4/2010 | Tokiwa et al. .......... | 365/185.05 |
| 2010/0133627 A1 * | 6/2010 | Mizukami et al. .......... | 257/392 |

OTHER PUBLICATIONS

H. Tanaka, et al., "Bit Cost Scalable Technology with Punch and Plug Process for Ultra High Density Flash Memory", 2007 Symposium on VLSI Technology Digest of Technical Papers, pp. 14-15.

* cited by examiner

*Primary Examiner*—Gene N Auduong
(74) *Attorney, Agent, or Firm*—Oblon, Spivak, McClelland, Maier & Neustadt, L.L.P.

(57) ABSTRACT

In a three dimensional stacked nonvolatile semiconductor memory according to the present invention, a first block has a selected first cell unit including a memory cell to be read and a non-selected second cell unit not including a memory cell to be read. A read potential or a transfer potential higher than the read potential is applied to the word line in the first block in a state that a ground potential is applied to a channel of a memory cell existing nearer to the bit line side than a memory cell in the second cell unit to which the read potential is applied, after which all the memory cells in the second cell unit are cut off from the bit line, the bit line is set to a precharge potential, and read is performed to the a memory cell to be read in the first cell unit.

20 Claims, 27 Drawing Sheets

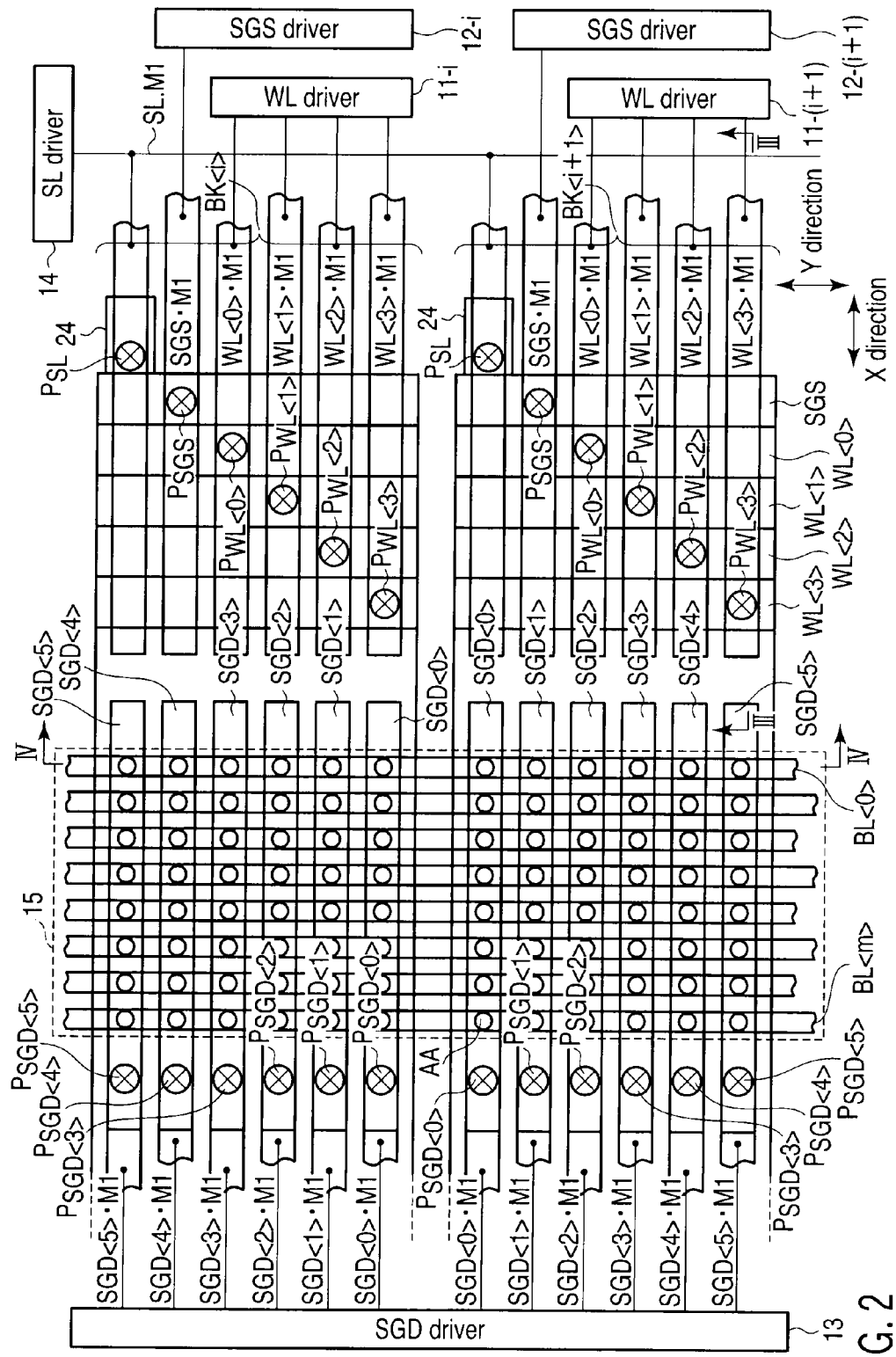
F I G. 2

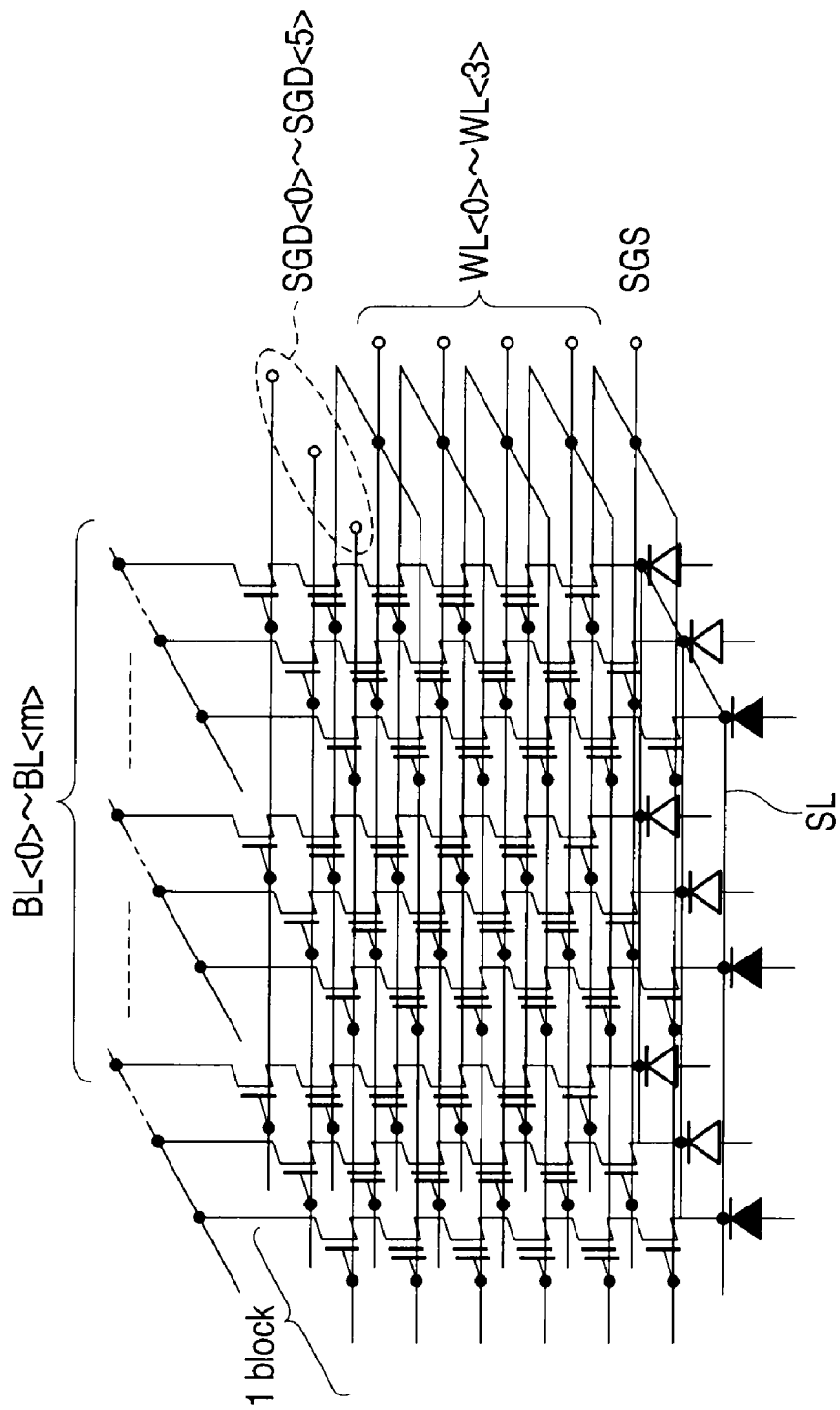
F I G. 7

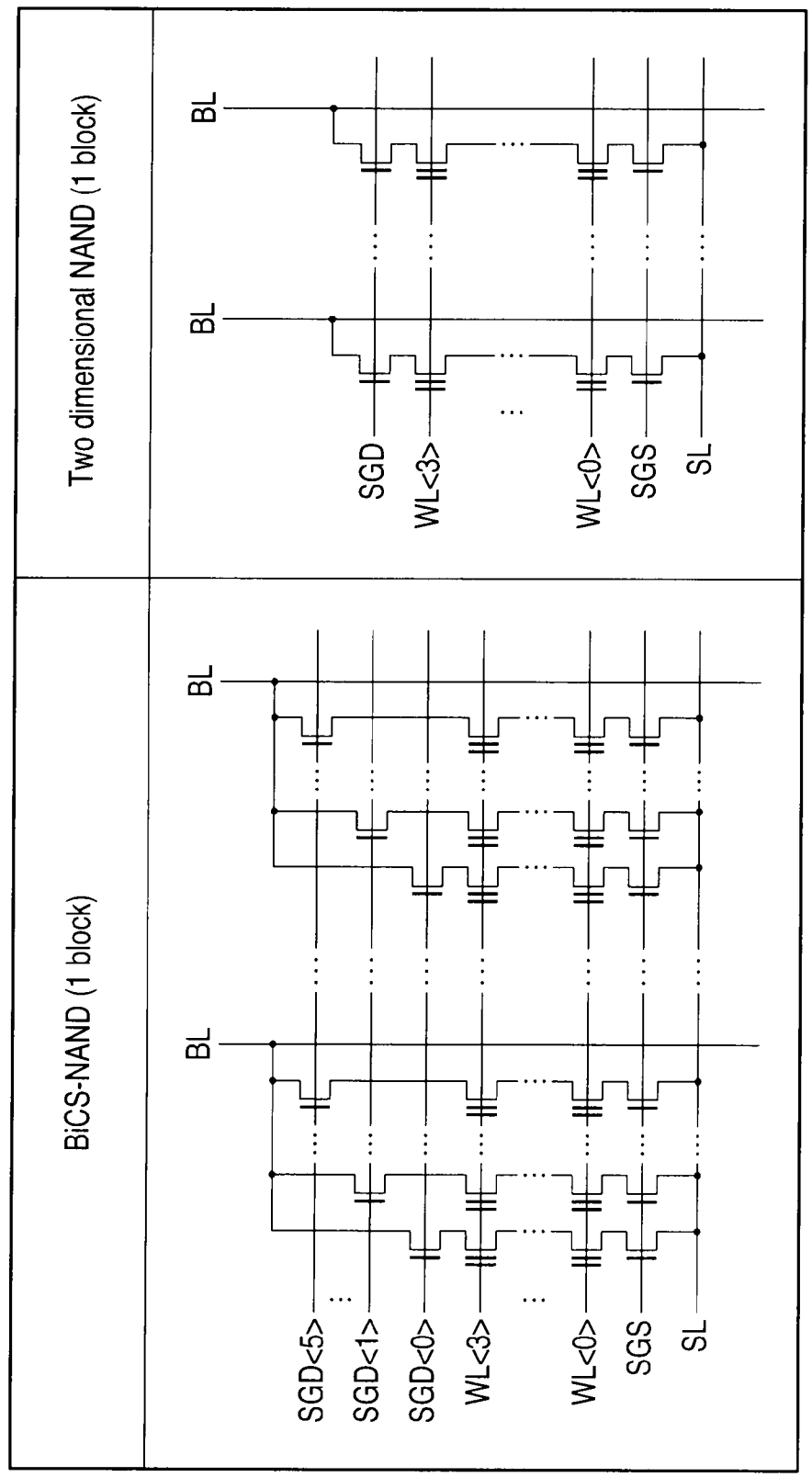
F I G. 8

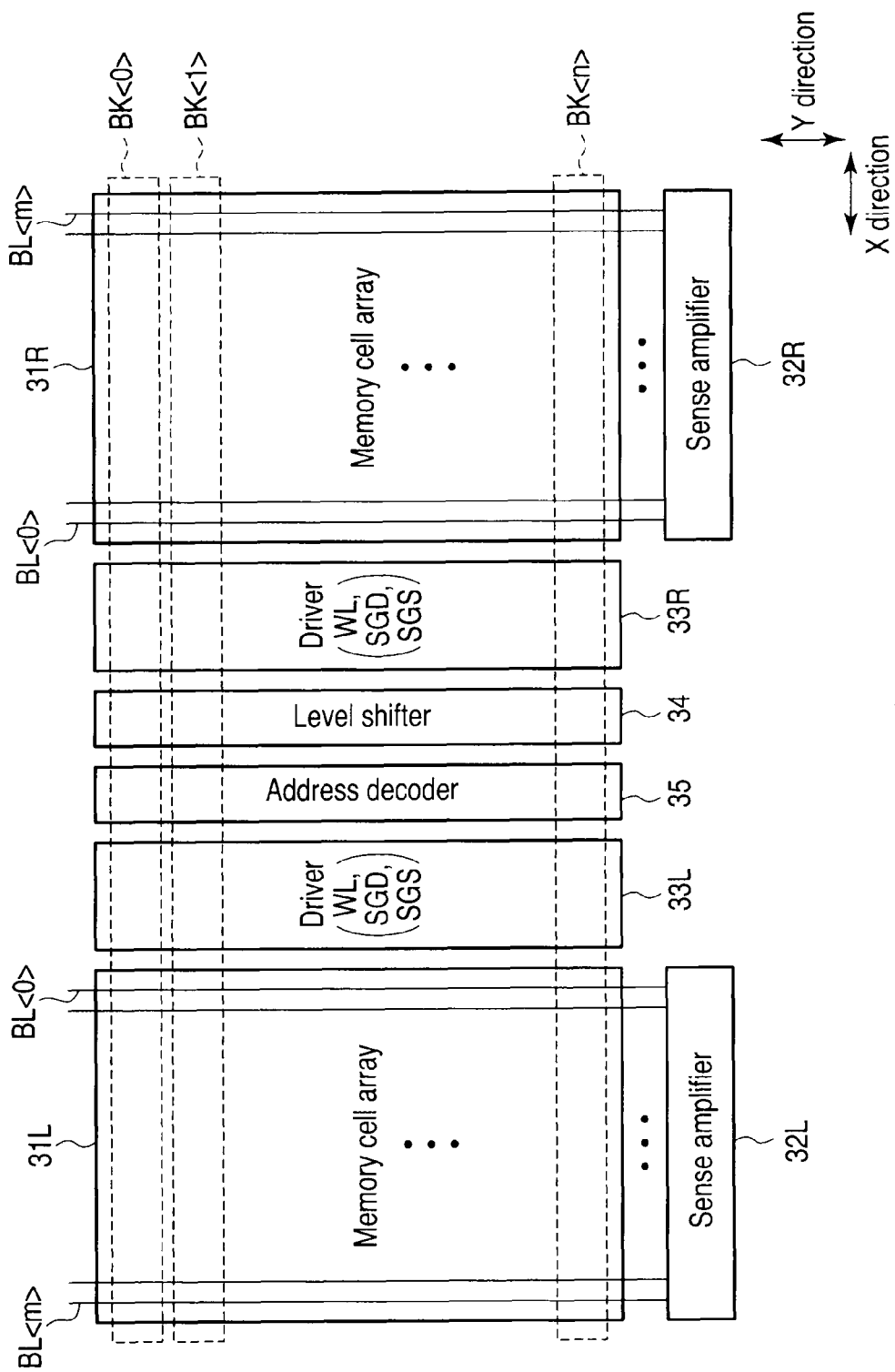
F I G. 11

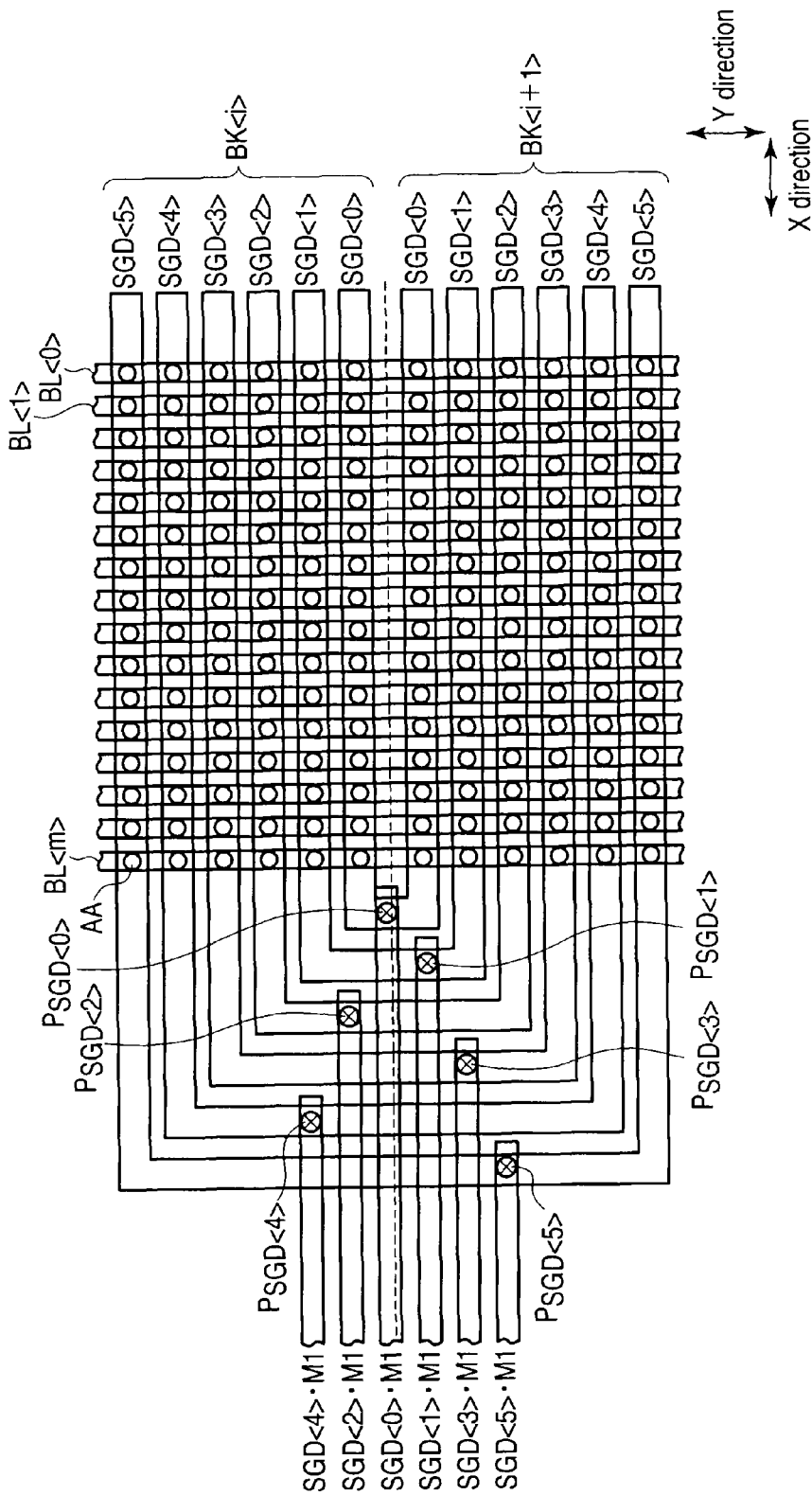
F I G. 14

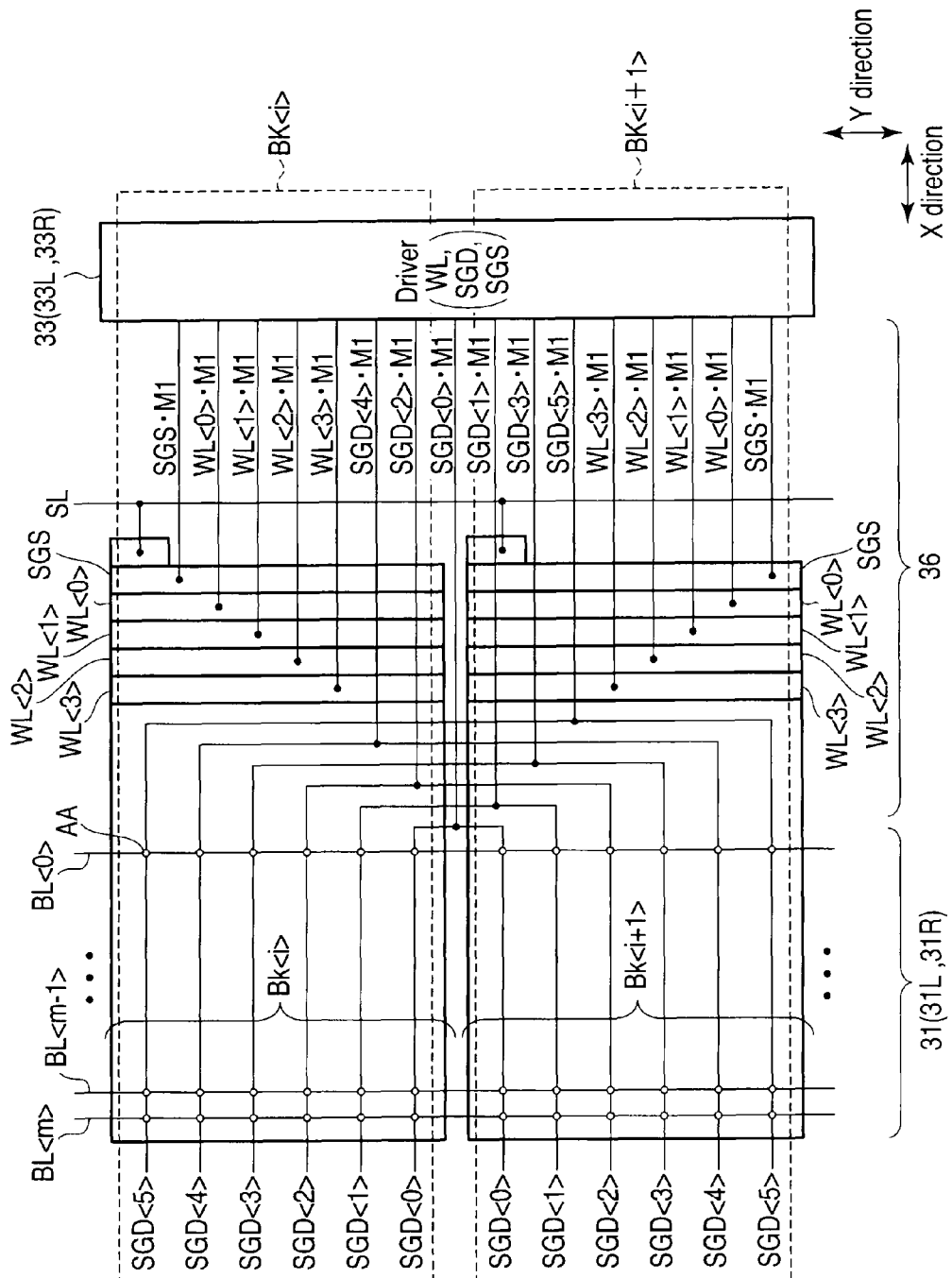
F I G. 15

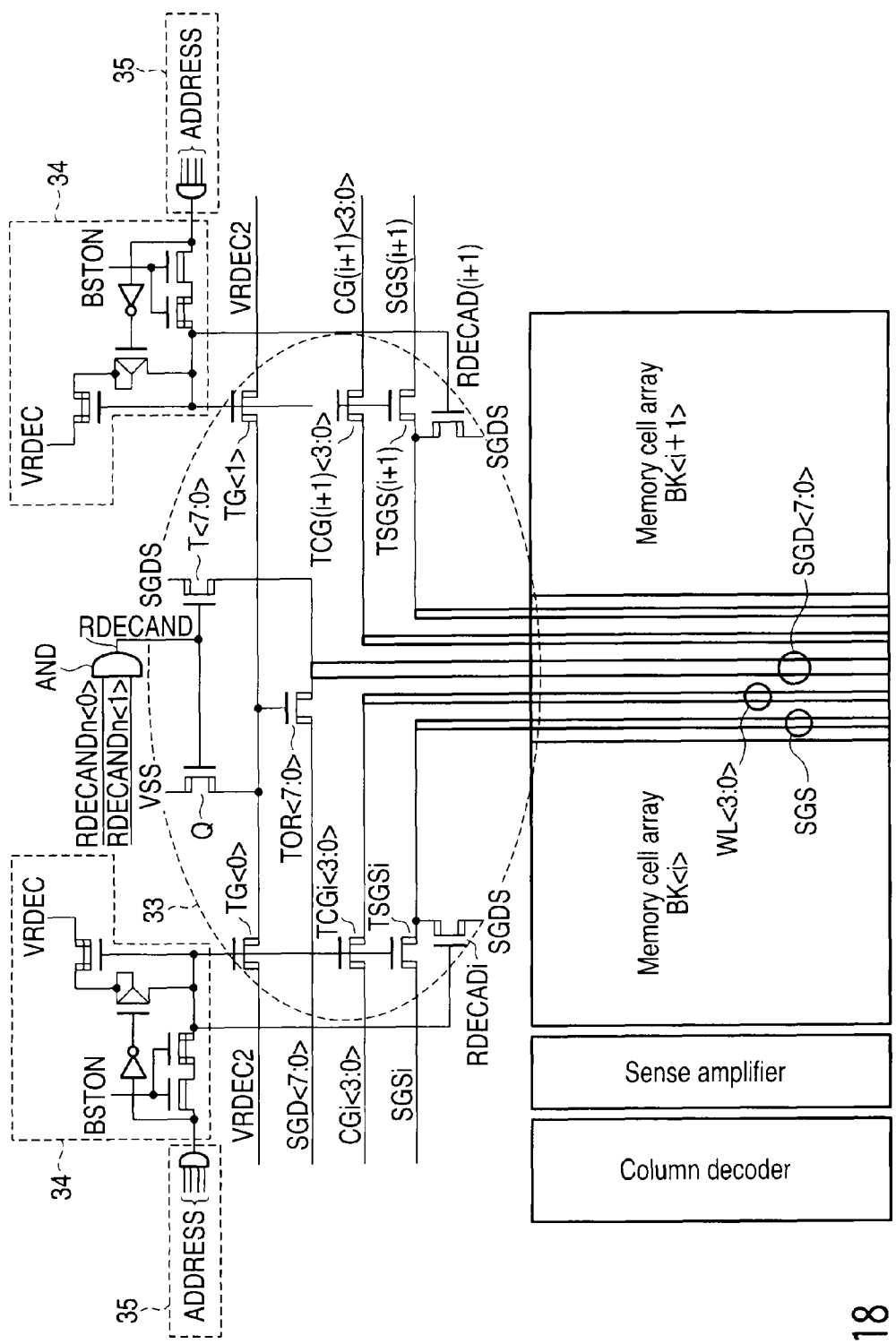
F I G. 18

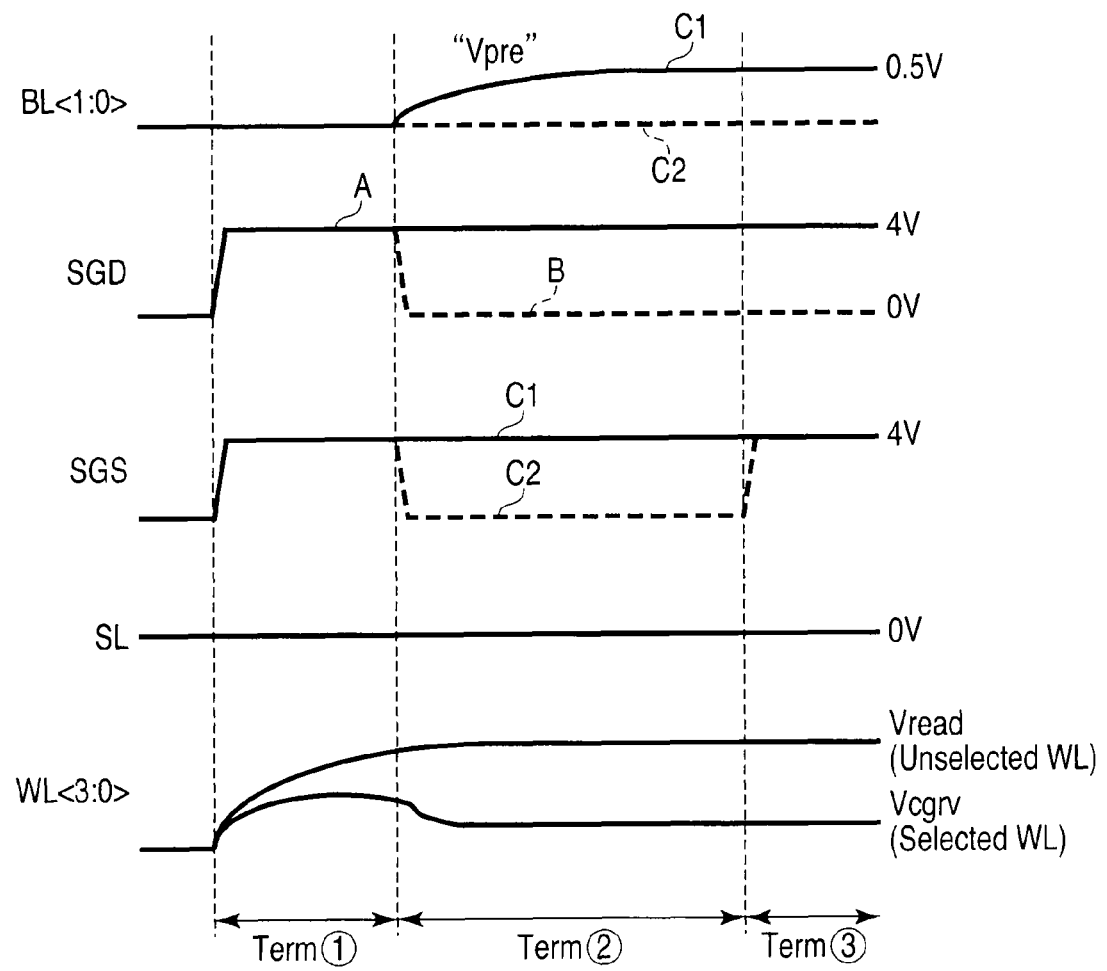
F I G. 25

US 7,852,676 B2

THREE DIMENSIONAL STACKED NONVOLATILE SEMICONDUCTOR MEMORY

CROSS-REFERENCE TO RELATED APPLICATIONS

This application is based upon and claims the benefit of priority from prior Japanese Patent Application No. 2008-112660, filed Apr. 23, 2008, the entire contents of which are incorporated herein by reference.

BACKGROUND OF THE INVENTION

1. Field of the Invention

The present invention relates to a three dimensional stacked nonvolatile semiconductor memory.

2. Description of the Related Art

BiCS (Bit Cost Scalable) technology is known as a technology for suppressing a bit cost of a semiconductor memory by increasing the capacity thereof by a three dimensional structure (refer to, for example, "Bit Cost Scalable Technology with Punch and Plug Process for Ultra High Density Flash Memory" 2007 Symposium on VLSI Technology Digest of Technical Papers. p. 14).

A nonvolatile semiconductor memory to which the BiCS technology is applied (hereinafter, called a BiCS memory) has a feature in that it not only has a three dimensional structure but makes bit cost scalability possible so that a bit cost can be reduced in proportion to an increase of the number of stacked layers by devising a device structure and a process technology.

In, for example, a NAND flash memory to which the BiCS technology is applied (hereinafter, called a BiCS-NAND flash memory), a memory capacity, which greatly exceeds the limit of the memory capacity of a NAND flash memory having a two-dimensional structure, can be realized by increasing the number of cells in a longitudinal direction which comprise a NAND column by increasing the number of stacked layers.

However, since the BiCS memory which is represented by a BiCS-NAND flash memory has a unique device structure, there are many problems to be solved to practically use the BiCS memory.

A read disturb is exemplified as one of the problems.

The BiCS memory has such a feature that cell units are included in one block connected to one bit line. Further, the cell units cannot be selected at the same time from the viewpoint of a circuit operation. Accordingly, a non-selected cell unit which does not include a memory cell to be read exists in a selected block.

This problem does not occur in a flash memory having a two-dimensional structure.

Therefore, read disturb must be examined to prevent variation of a threshold voltage of a memory cell in a non-selected cell unit in a selected block in read.

In particular, in the BiCS memory, since it is not necessary to apply a read potential and a transfer potential to the cell unit in the non-selected block unlike the flash memory having the two-dimensional structure, it is not necessary to examine read disturb to the cell unit in the non-selected block. However, when a read potential is applied to a non-selected memory cell because a non-selected cell unit in a selected block is cut off from a bit line, a threshold voltage is varied in a non-selected memory cell existing nearer to the bit line side than the above non-selected memory cell by read disturb depending on the state of a threshold voltage of the non-selected memory cell to which the read potential is applied.

BRIEF SUMMARY OF THE INVENTION

A three dimensional stacked nonvolatile semiconductor memory according to an aspect of the present invention comprises a semiconductor substrate, a memory cell array comprised of first and second blocks disposed on the semiconductor substrate side by side in a first direction, and a first driver disposed on one end of the memory cell array in a second direction orthogonal to the first direction.

Each of the first and second blocks is comprised of at least three conductive layers stacked on the semiconductor substrate by being insulated from each other, a bit line disposed on the at least three conductive layers by being insulated therefrom, and columnar semiconductors having lower ends connected to the semiconductor substrate and upper ends connected to the bit line and passing through the at least three conductive layers.

The uppermost layer of the at least three conductive layers is comprised of first select gate lines extending in the second direction, the lowermost layer of the at least three conductive layers is a second select gate line, the remaining conductive layers excluding the uppermost layer and the lowermost layer of the at least three conductive layers are a word line, and the remaining conductive layers excluding the uppermost layer of the at least three conductive layers have a plate shape whose width in the first direction is larger than the width in the first direction of the first select gate lines.

Select gate transistors are comprised of the first select gate lines and the columnar semiconductors, and the second select gate line and the columnar semiconductors, respectively and memory cells are comprised of the word line and the columnar semiconductors, respectively.

The first block has a selected first cell unit including a memory cell to be read and a non-selected second cell unit not including a memory cell to be read.

A read potential or a transfer potential higher than the read potential is applied to the word line in the first block in a state that a ground potential is applied to a channel of a memory cell existing nearer to the bit line side than a memory cell in the second cell unit to which the read potential is applied, after which all the memory cells in the second cell unit are cut off from the bit line, the bit line is set to a precharge potential, and read is performed to the memory cell to be read in the first cell unit.

Further, the read potential and the transfer potential are not applied to the word line in the second block in the read.

BRIEF DESCRIPTION OF THE SEVERAL VIEWS OF THE DRAWING

FIG. 2 is a plan view of the BiCS-NAND flash memory;
FIG. 7 is an equivalent circuit view of a memory cell array;
FIG. 8 is a comparative view comparing a BiCS-NAND with a two-dimensional NAND;
FIG. 11 is a view showing a third example of the block layout;

FIG. 14 is a plan view when the select gate lines shown in FIG. 13 are arranged as a device;

FIG. 15 is a view showing a layout of select gate lines on a bit line side;

FIG. 18 is a view showing an example of a driver circuit;

FIG. 25 is a timing view showing a read method according to an example of the present invention;

DETAILED DESCRIPTION OF THE INVENTION

Figure 1:
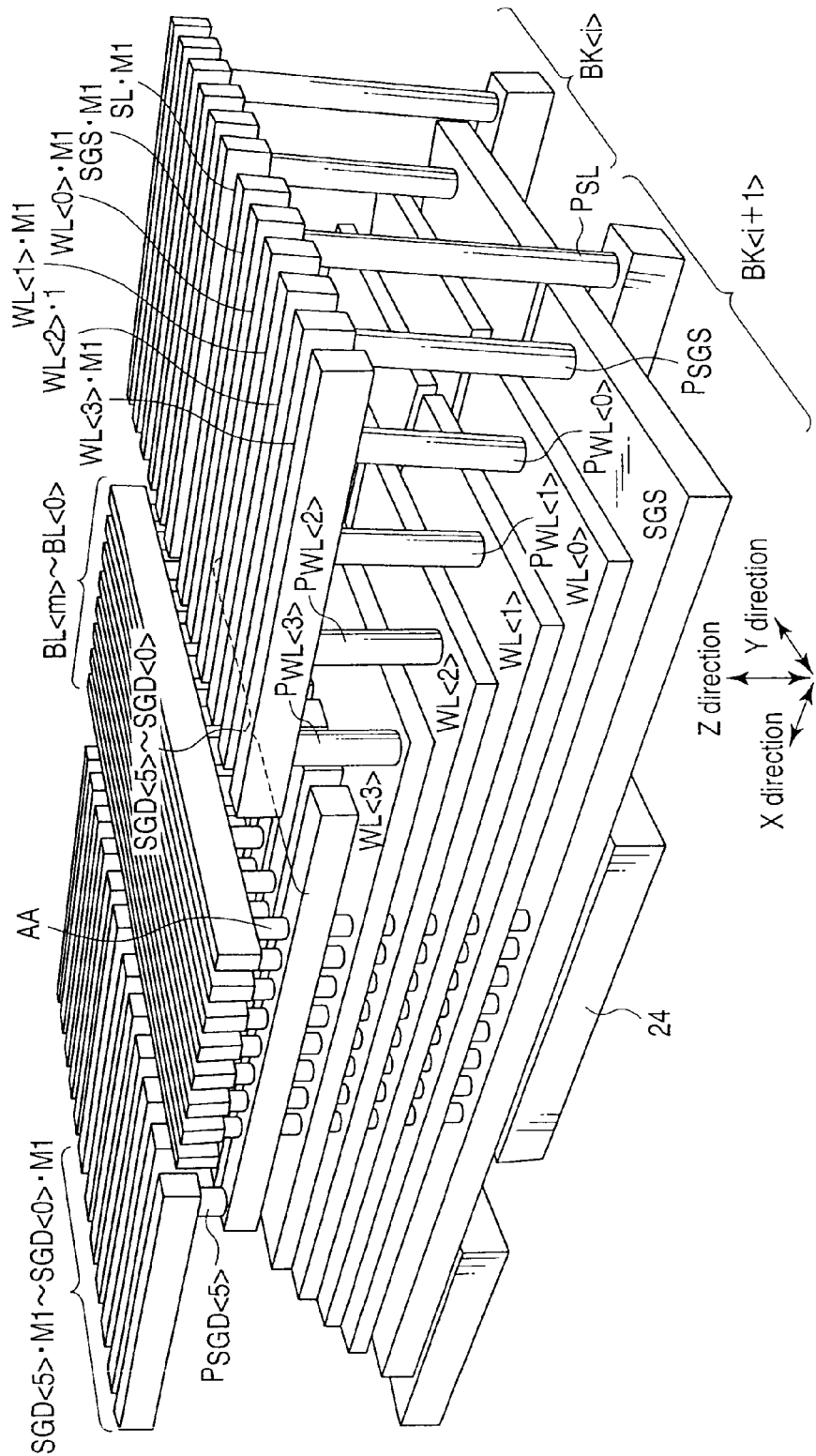
FIG. 1 is a bird's eye view of a BiCS-NAND flash memory.

A three dimensional stacked nonvolatile semiconductor memory of an aspect of the present invention will be described below in detail with reference to the accompanying drawing.

1. Outline

An example of the present invention proposes a read method of preventing read disturb, which is caused by a structure specific to a BiCS memory, i.e., variation of a threshold value of a memory cell in a non-selected cell unit in a selected block.

When a feature of the BiCS memory is expressed simply from the viewpoint of a circuit, cell units are included in one block connected to one bit line. In this case, the cell units cannot be selected at the same time from the viewpoint of a circuit operation. Accordingly, in read, one of cell units connected to the one bit line must be selected.

That is, a non-selected cell unit, which does not include a memory cell to be read in the selected block, is cut off from the bit line in the read.

Further, when a non-selected memory cell, to which a read potential is applied, in the non-selected cell unit, is in a high threshold value state, i.e., for example, a "0" state of a binary value ("0"/"1") stored therein, the non-selected memory cell keeps a turned-off state before and after the read potential is applied thereto.

Accordingly, a channel of a memory cell existing nearer to the bit line side than the memory cell, to which the read potential is applied, in the non-selected cell unit, is in a floating state as well as is boosted by capacitance coupling when the read potential is applied to the memory cell.

In contrast, in the BiCS memory, a ground potential is transferred from a source line to a channel of a memory cell existing nearer to the source line side than the memory cell, to which the read potential is applied, in the non-selected cell unit, in read.

Accordingly, since a large potential difference is generated between a source and a drain of the memory cell, to which the read potential is applied, in the non-selected cell unit, punch-through is caused between the source and the drain of the memory cell.

A hot carrier is generated by the punch-through and injected into a charge accumulation layer of a memory cell existing nearer to the bit line side than the memory cell, to which the read potential is applied, in the non-selected cell unit, and a threshold voltage is varied thereby.

To prevent the read disturb, it is preferable to set operation timing at which generation of a large potential difference is prevented between the source and the drain of the memory cell to which the read potential is applied, in the non-selected cell unit.

Thus, the example of the present invention proposes a read method of applying a ground potential to a channel of a memory cell existing nearer to a bit line side than a memory cell, to which a read potential is applied, in a non-selected cell unit in a block selected in read to thereby prevent channel boost.

Specifically, the read potential or a transfer potential higher than the read potential is applied to a word line in the selected block in a state that the ground potential is applied to the channel of the memory cell existing nearer to the bit line side than the memory cell, to which the read potential is applied, in the non-selected cell unit in the selected block, after which all the memory cells in the non-selected cell unit are cut off from the bit line, the bit line is set to a precharge potential, and read is performed to a memory cell to be read in the selected cell unit.

The ground potential is transferred from, for example, the bit line to the channel of memory cell existing nearer to the bit line side than the memory cell, to which the read potential is applied, in the non-selected cell unit.

With this operation, when the read potential or the transfer potential higher than the read potential is applied to the word line in the selected block, the channel of the memory cell existing nearer to the bit line side than the memory cell, to which the read potential is applied, in the non-selected cell unit is not boosted, and thus read disturb can be improved.

2. BiCS memory (1) Basic Structure

First, a basic structure of a BiCS memory will be explained.

FIG. 1 shows a bird's eye view of a BICS-NAND flash memory.

The NAND flash memory is comprised of blocks each of which acts, for example, as a unit to be erased. Here, two blocks BK<i>, BK<i+1> are shown in the figure.

A source diffusion layer 24 formed in a semiconductor substrate is shared by, for example, all the blocks. The source diffusion layer 24 is connected to a source line SLM1 through a contact plug $P_{SL}$. Further, at least three conductive layers (in the example, six-layer structure) comprised of, for example, conductive polysilicon are laminated on the source diffusion layer 24.

The remaining five conductive layers excluding the uppermost layer are formed in a plate shape, respectively in the one block BK<i+1> as well as the ends thereof in the X-direction are formed stepwise so that they are in contact with the respective conductive layers. A lowermost layer acts as a select gate line SGS on the source line side, and the remaining four conductive layers excluding the lowermost and uppermost layers act as word lines WL<0>, WL<1>, WL<2>, and WL<3>.

The uppermost layer is comprised of line-shaped conductive wires extending in the X-direction. Six conductive wires, for example, are disposed in the one block BK<i+1>. The six conductive wires, for example, of the uppermost layer act as select gate lines SGD<0>, . . . , SGD<5> on a bit line side.

Active layers (active areas) AA for constituting a NAND cell unit are formed columnarly in a Z-direction (direction vertical to the front surface of the semiconductor substrate) so that they reach the source diffusion layer 24 passing through the conductive layers.

The upper ends of the active layers AA are connected to bit lines BL<0>, . . . , BL<m> extending in a Y-direction. Further, the select gate line SGS on the source line side is connected to an interconnect line SGS·ML extending in the X-direction through a contact plug $P_{SGS}$, and the word lines WL<0>, WL<1>, WL<2>, and WL<3> are connected to interconnect lines WL<0>·M1, WL<1>·M1, WL<2>·M1, and WL<3>·M1 extending in the X-direction through contact plugs $P_{WL<0>}$, $P_{WL<1>}$, $P_{WL<2>}$, $P_{WL<3>}$, respectively.

Further, select gate lines SGD<0>, . . . , SGD<5> on the bit line side are connected to interconnect lines SGD<0>·M1, . . . , SGD<5>·M1 extending in the X-direction through contact plugs $P_{SGD<0>}$, . . . , $P_{SGD<5>}$, respectively.

The bit lines BL<0>, . . . , BL<m> and the interconnect lines SGS·M1, WL<0>·M1, WL<1>·M1, WL<2>·M1, and WL<3>·M1, SGD<0>·M1, . . . , SGD<5>·M1 are comprised of, for example, metal.

FIG. 2 shows a plan view of the BICS-NAND flash memory of FIG. 1.

The columnar active layers AA are disposed in an array-state when viewed from the upper surface of the semiconductor substrate and comprise a memory cell array 15. Although the NAND cell unit is formed in each of the active layers AA, it will be described later in detail.

WL drivers 11-$i$ and 11($i$+1) are connected to the word lines WL<0>, WL<1>, WL<2>, and WL<3> through the interconnect lines WL<0>·M1, WL<1>·M1, WL<2>·M1, WL<3>·M1 and drive them in write, in read, and in erase.

SGS drivers 12-$i$ and 12-($i$+1) are connected to the select gate line SGS on the source line side through the interconnect line SGSML. A SGD driver 13 is connected to the select gate lines SGD<0>, . . . , SGD<5> on the bit line side through the interconnect lines SGD<0>·M1, . . . , SGD<5>·M1.

An SL driver 14 is connected to the source diffusion layer 24 through the source line SL·M1.

In this layout, the WL drivers 11-$i$ and 11-($i$+1) and the SGS drivers 12-$i$ and 12-($i$+1) are disposed on one end side of the memory cell array 15 in the X-direction, and the SGD driver 13 is disposed on the other end side of the memory cell array 15 in the X-direction in consideration of an increase of the number of transistors constituting the drivers as a peripheral circuit.

Figure 3:
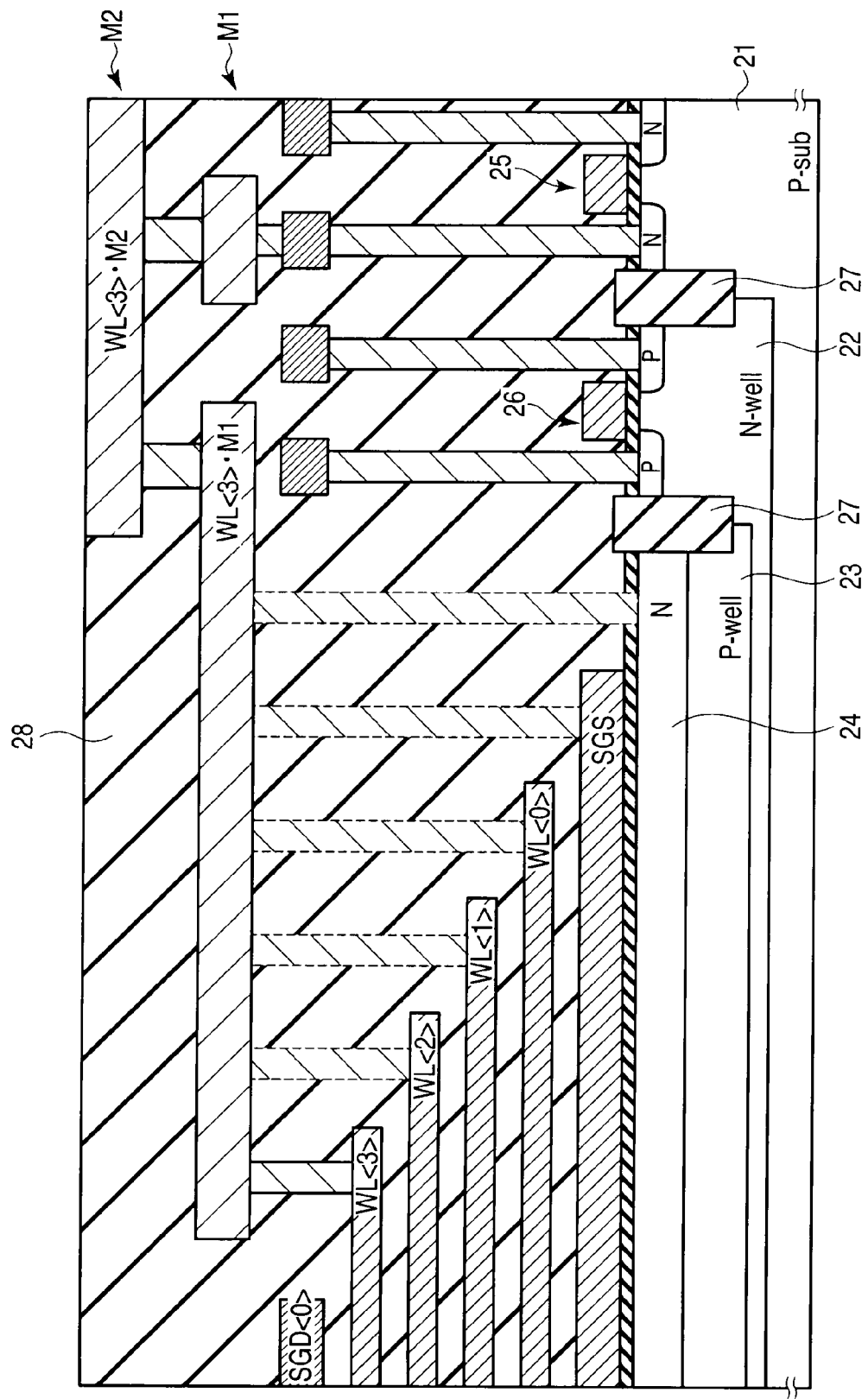
FIG. 3 is a sectional view taken along line III-III of FIG. 2.

FIG. 3 is a sectional view taken along line III-III of FIG. 2.

An N-type well region (N-well) 22 and a P-type well region (P-well) 23 are formed in a P-type semiconductor substrate (P-sub) 21. The source diffusion layer 24 is an N-type diffusion layer and formed in the P-type well region 23.

An N-channel FET (for example, N-channel MOSFET) 25 is formed in the P-type semiconductor substrate 21, and a P-channel FET (for example, P-channel MOSFET) 26 is formed in the N-type well region 22. These transistors comprise the peripheral circuit (for example, the drivers) formed in a peripheral portion of a memory cell array.

The select gate line SGS on the source line side and the word lines WL<0>, WL<1>, WL<2>, and WL<3> are connected to the transistors constituting the drivers through the interconnect line in a first metal layer M1 and through an interconnect line in a second metal layer M2 on the first metal layer M1.

To explain the word line WL<3> as an example, the word line WL<3> is connected to the N-channel FET 25 constituting a word line driver through the interconnect line WL<3>·M1 in the first metal layer M1 and through an interconnect line WL<3>·M2 in the second metal layer M2 on the first metal layer M1.

Here, gate electrodes of the N-channel FET 25 and the P-channel FET 26 are formed simultaneously with, for example, the select gate line SGS on the source line side.

That is, the gate electrodes of the N-channel FET 25 and the P-channel FET 26 have the same structure and the same thickness as those of the select gate line SGS on the source line side.

Figure 4:
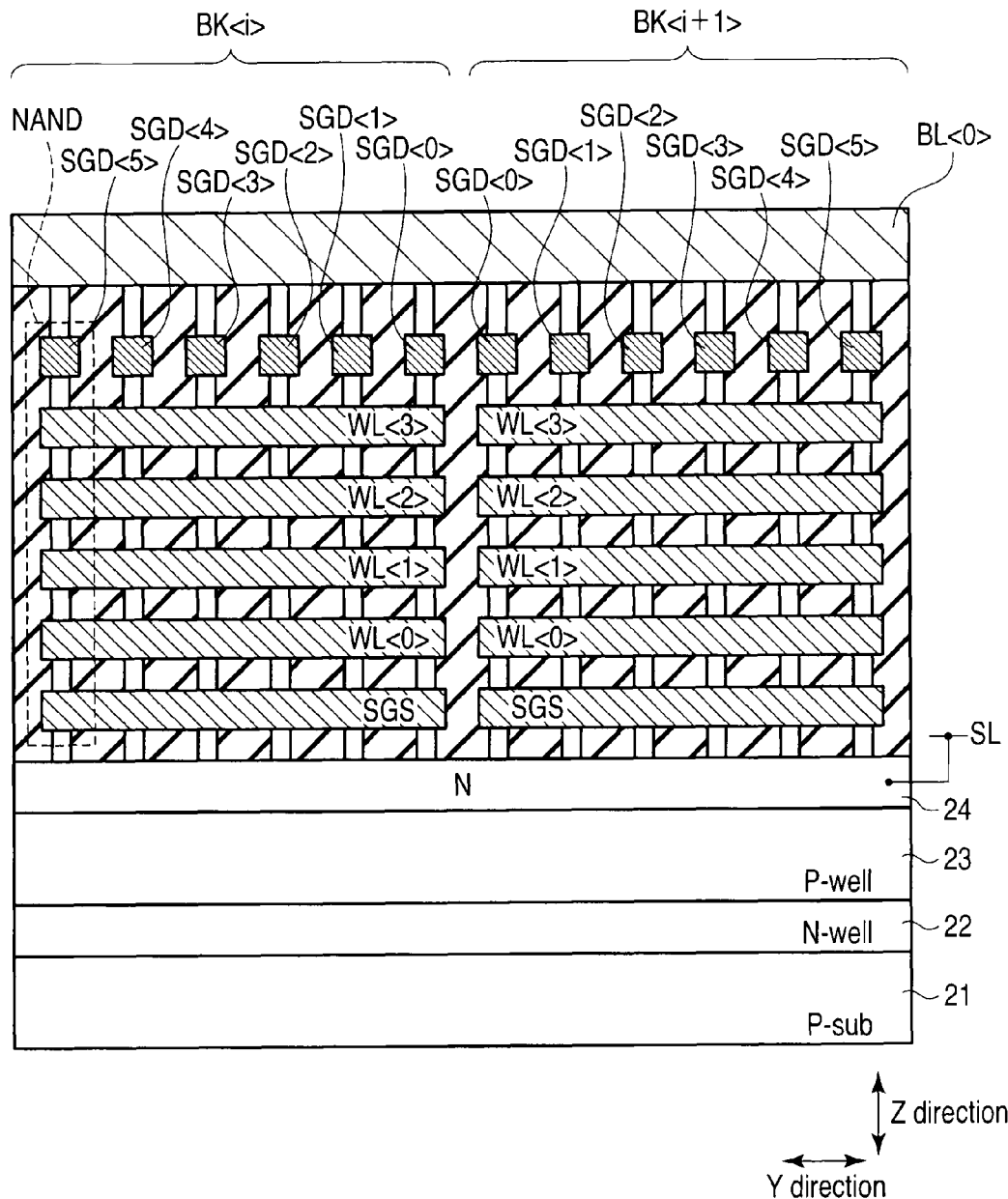
FIG. 4 is a sectional view taken along line IV-IV of FIG. 2.

FIG. 4 is a sectional view taken along line IV-IV of FIG. 2.

One ends (lowermost portions) of the active layers (active areas) AA are connected to the source diffusion layer 24 passing through the select gate line SGS on the source line side, the word lines WL<0>, WL<1>, WL<2>, and WL<3>, and the select gate lines SGD<0>, SGD<5> on the bit line side, and the other ends (uppermost portions) thereof are connected to a bit line BL<0>.

The active layers AA are formed columnarly in the Z-direction (direction vertical to the front surface of the semiconductor substrate), and the NAND cell unit NAND is formed in each of the active layers AA.

Figure 5:
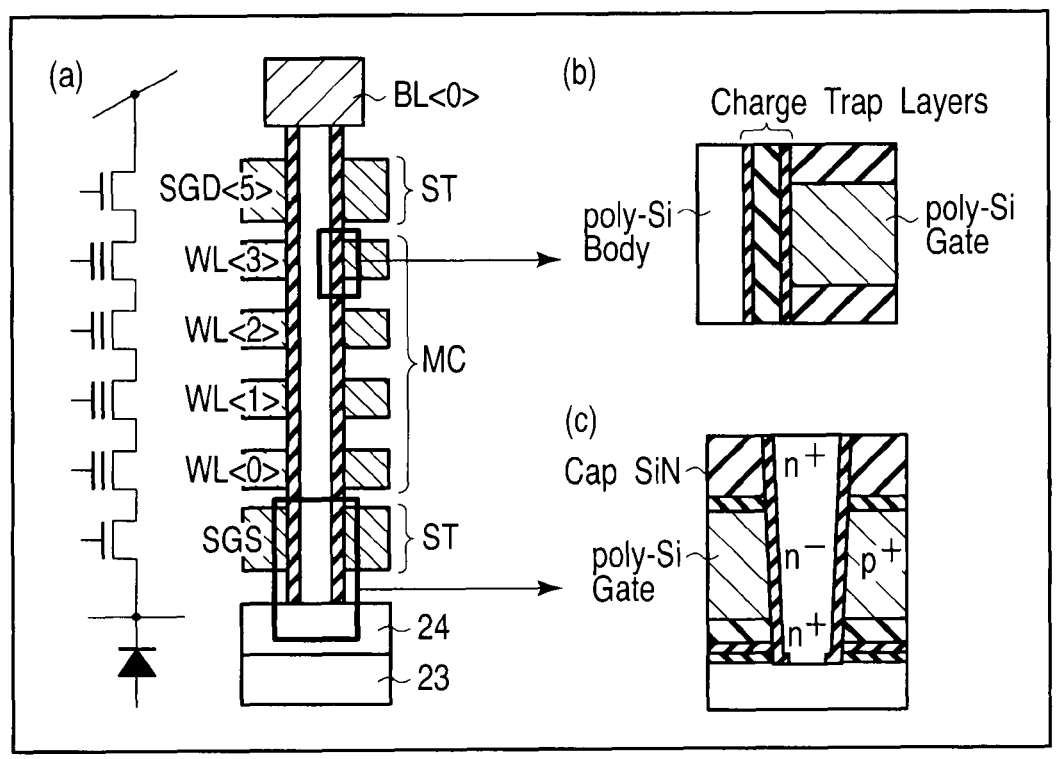
FIG. 5 is a structure view of a NAND cell unit.

FIG. 5 shows an example of a structure of the NAND cell unit NAND.

A memory cell MC has a MONOS structure.

The MONOS structure means a memory cell structure having a charge accumulation layer comprised of an insulation material such as nitride. The charge accumulation layer has a multilayer structure (charge trap layers), and ONO (oxide/nitride/oxide) is exemplified here.

A select gate transistor ST has the same structure as that of, for example, the memory cell MC.

However, a gate insulation film of the select gate transistor ST may have a structure different from that of the memory cell MC, i.e., may have a structure that includes no charge accumulation layer (for example, a single silicon oxide film).

Figure 6:
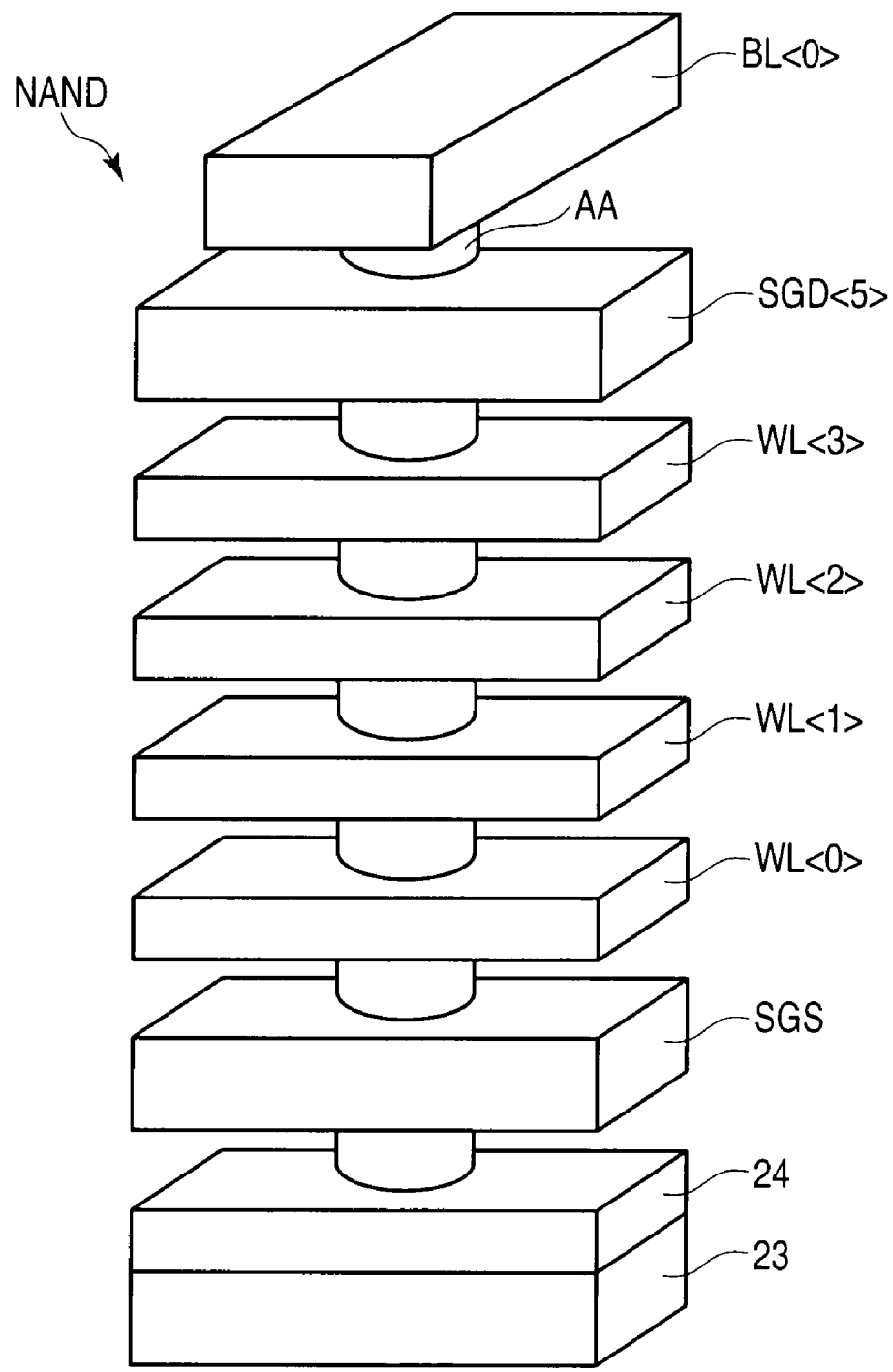
FIG. 6 is a bird's eye view of the NAND cell unit.

FIG. 6 shows a bird's eye view of the NAND cell unit.

One of the features of the NAND cell unit having a three dimensional structure resides in that each of the select gate line SGS on the source line side, the word lines WL<0>, WL<1>, WL<2>, and WL<3>, and the select gate lines SGD<0>, . . . , SGD<5> on the bit line side has a structure for surrounding each of the side surfaces of the columnar active layers AA.

Accordingly, even if the active layers AA are made, for example, thinner and a larger number of the active layers AA are formed on the semiconductor substrate to increase a capacity, a force for driving the transistors constituting the NAND cell unit can be sufficiently secured.

FIG. 7 shows an equivalent circuit of the memory cell array.

Since the BiCS-NAND flash memory has a three dimensional structure, the equivalent circuit is shown in a three dimension.

A larger number of memory cells constituting a NAND column can more contribute to an increase of the capacity.

However, as the number of the memory cells constituting the NAND column is more increased, there is a possibility that the characteristics of the memory cells are dispersed in a manufacturing process from the characteristics of a BiCS structure.

When the dispersion of the characteristics is taken into consideration, the NAND column is comprised of a smaller number of the memory cells (for example, four memory cells, eight memory cells, and the like). Further, the same structure may be stacked on a structure shown by the equivalent circuit of FIG. 7.

FIG. 8 is a view showing BiCS-NAND in comparison with two-dimensional NAND.

In the NAND flash memory having the two-dimensional structure (two-dimensional NAND), one NAND cell unit in one block is connected to one bit line BL, whereas in the BiCS-NAND, NAND cell units in one block are connected to one bit line BL.

Accordingly, as explained below, one of the cell units in the one block connected to the one bit line BL is selected by the select gate lines SGD<0>, ..., SGD<5> on the bit line side in a write operation and a read operation.

(2) Basic Operations

Basic operations of the BiCS-NAND flash memory of FIGS. 1 to 8 will be explained.

Since the basic write, read, and erase operations are the same as those of the NAND flash memory having the two-dimensional structure, matters specific to the BiCS-NAND flash memory will be explained here.

The concept of one block of the BiCS-NAND flash memory is different from that of the NAND flash memory having the two-dimensional structure.

Although the one NAND cell unit in the one block is connected to the one bit line BL in the NAND flash memory having the two-dimensional structure, the NAND cell units in the one block are connected to the one bit line BL in the BiCS-NAND flash memory.

For example, in the plan view of FIG. 2, six NAND cell units (corresponding to the number of the active layers AA in the figure) in the block BK<i+1> are connected to the bit line BL<0>.

Accordingly, in the write operation and the read operation, one of the six NAND cell units in the block BK<i+1> connected to the bit line BL<0> must be selected.

The selection is performed by select gate lines SGD<0>, ..., SGD<5> mon the bit line side. The select gate lines SGD<0>, ..., SGD<5> on the bit line side are individually connected to six NAND cell units in the Y-direction in the block BK<i+1>.

The erase operation is performed collectively to, for example, all the memory cells in one block like the NAND flash memory having the two-dimensional structure.

The BiCS-NAND flash memory can be applied to both a binary memory, which stores binary data in one memory cell, and a multi-level memory which stores multi-level data having a ternary or more value in one memory cell.

3. Embodiments

Embodiment of the present invention will be explained.

(1) Block Layout

Figure 9:
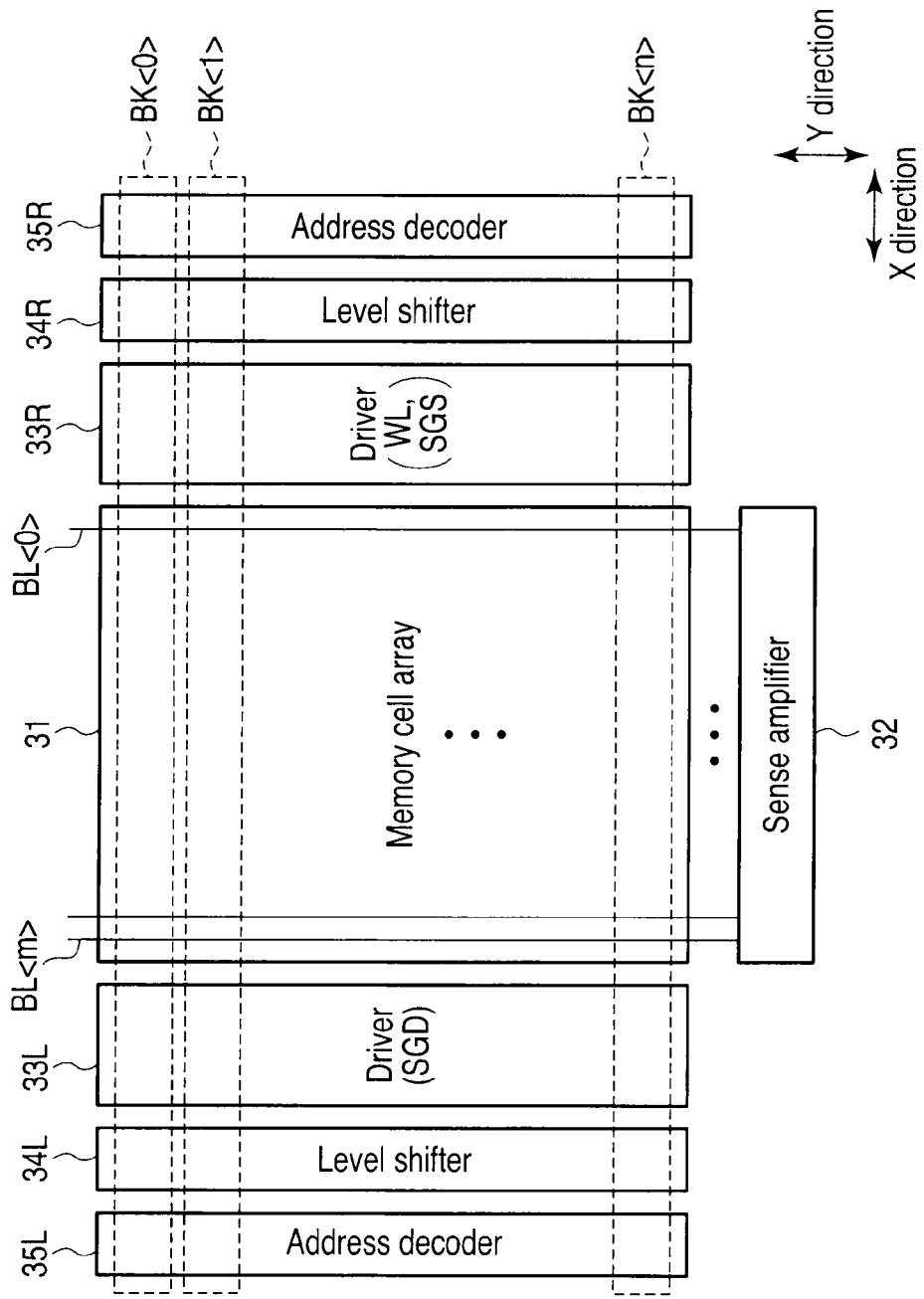
FIG. 9 is a view showing a first example of a block layout.

FIG. 9 shows a first example of a block layout of a BiCS memory.

The block layout corresponds to, for example, the BiCS-NAND flash memory of FIG. 1 and has a feature in that a select gate line driver on a bit line side is disposed on one end of a memory cell array and a word line driver and a select gate line driver on a source line side are disposed on the other end of the memory cell array.

A driver 33L, a level shifter 34L, and an address decoder 35L are disposed on one end of the memory cell array 31 in the X-direction (on a left side). The driver 33L is a driver for driving a select gate line SGD on the bit line side and includes a transfer transistor.

A driver 33R, a level shifter 34R, and an address decoder 35R are disposed on the other end of the memory cell array 31 in the X-direction (on a right side). The driver 33R is a driver for driving a word line WL and a select gate line SGS on the source line side and includes a transfer transistor.

Further, a sense amplifier 32 is disposed on one end of the memory cell array 31 in the Y-direction. Bit lines BL<0>, ..., BL<m> extending in the Y-direction are disposed on the memory cell array 31 and connected to the sense amplifier 32.

Since the block layout corresponds to the BiCS-NAND flash memory of FIG. 1, the select gate lines SGD on the bit line side are disposed in blocks BK<0>, BL<1>, ..., BK<n>, respectively. That is, since the area of the driver for driving the select gate lines SGD on the bit line side is increased, a select gate line driver on the bit line side is disposed on the one end of the memory cell array 31 in addition to the word line driver and the select gate line driver on the source line side disposed on the other end of the memory cell array 31.

Figure 10:
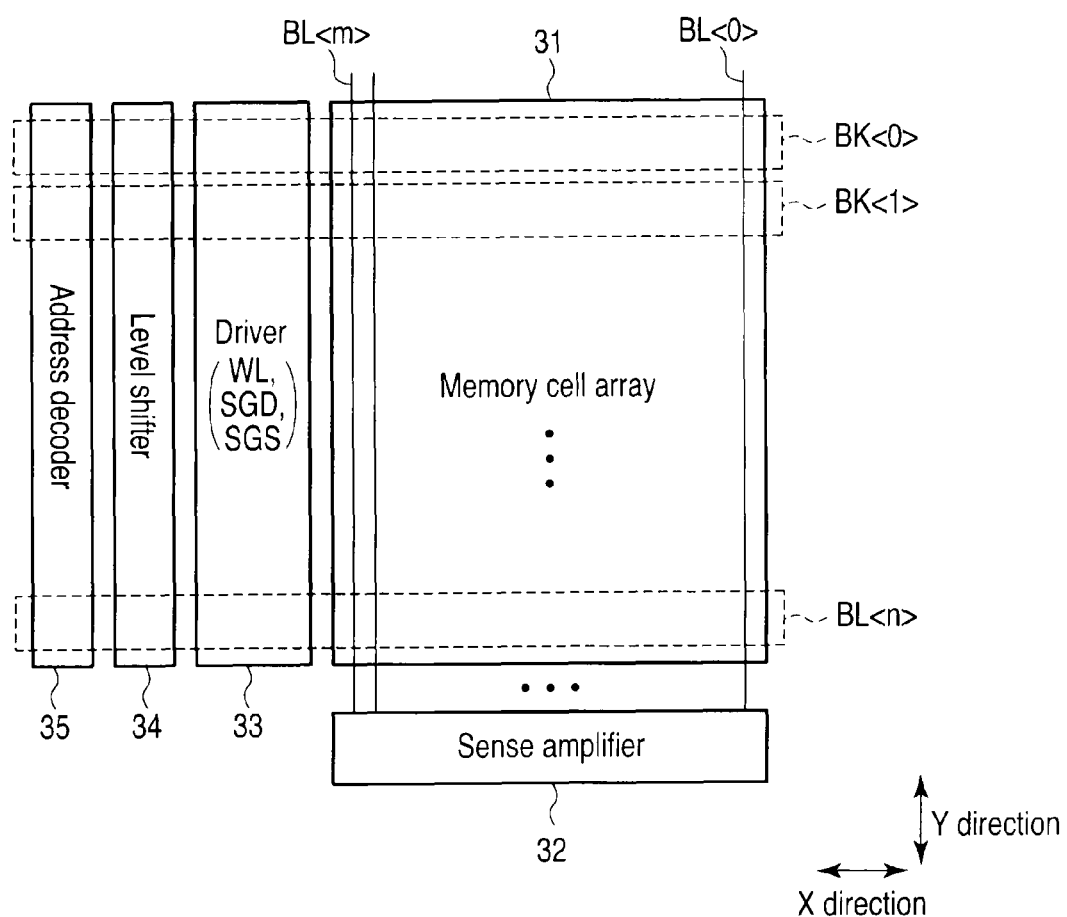
FIG. 10 is a view showing a second example of the block layout.

FIG. 10 shows a second example of the block layout of the BiCS memory.

A feature of the second example resides in that drivers 33 for driving a word line WL, a select gate line SGS on a source line side, and a select gate line SGD on a bit line side are disposed together on one end of a memory cell array 31 in comparison with the first example.

The drivers 33, a level shifter 34, and an address decoder 35 are disposed on one end of the memory cell array 31 in the X-direction (on a left side). The drivers 33 are drivers for driving the word line WL, the select gate line SGS on the source line side, and the select gate line SDG on the bit line side and include transfer transistors.

Further, a sense amplifier 32 is disposed on one end of the memory cell array 31 in the Y-direction. Bit lines BL<0>, ..., BL<m> extending in the Y-direction are disposed on the memory cell array 31 and connected to the sense amplifier 32.

Since the drivers 33 for driving the word line WL, the select gate line SGS on the source line side and the select gate line SGD on the bit line side are disposed together as described above, an address decoder 34 and a level shifter 35 can be also disposed together at the same position. As a result, a layout of a peripheral circuit can be made efficiently.

However, in the above block layout, when the size of the memory cell array 31 is increased and further a memory cell is miniaturized and the word line WL, the select gate line SGS on the source line side and the select gate line SGD on the bit line side are disposed at narrow pitches, a problem arises in that a signal is delayed by a parasitic capacitance.

In particular, in the BiCS memory, the word line WL and the select gate line SGS on the source line side are formed in a plate shape. Accordingly, coupling noise is caused by an increase of a parasitic capacitance between the conductive wires.

FIG. 11 shows a third example of the block layout of the BiCS memory.

A feature of the third example resides in that two memory cell arrays 31L and 31R are disposed in comparison with the second example. Since disposition of the two memory cell arrays 31L and 31R can reduce the lengths of a word line WL, a select gate line SGS on a source line side, and a select gate line SGD on a bit line side in each memory cell array, a signal delay and coupling noise can be suppressed.

The memory cell arrays 31L and 31R are disposed in the X-direction side by side. Drivers 33L and 33R, a level shifter 34, and an address decoder 35 are interposed between the memory cell arrays 31L and 31R. The drivers 33L and 33R drive the word line WL, the select gate line SGS on the source line side, and the select gate line SGD on the bit line side and include transfer transistors.

Further, sense amplifiers 32L and 32R are disposed on one ends of the memory cell arrays 31L and 31R in the Y-direction. Bit lines BL<0>, ..., BL<m> extending in the Y-direction are disposed on the memory cell arrays 31L and 31R and connected to the sense amplifiers 32L and 32R.

Although the level shifter 34 and the address decoder 35 are shared by the two memory cell arrays 31L and 31R in the block layout, the driver 33L is disposed in correspondence with the memory cell array 31L, and the driver 33R is disposed in correspondence with the memory cell array 31R.

A reason why the drivers 33L and 33R cannot be shared by the two memory cell arrays 31L and 31R as described above is that since the drivers are comprised of a lot of transistors, when they are shared by the memory cell arrays 31L and 31R, a layout of wirings for connecting the memory cell arrays 31L and 31R to the drivers 33L and 33R is made complex. That is, when a driver is disposed on each memory cell array, a layout of wirings is more simplified than a case in which the drivers are shared by the two memory cell arrays.

Figure 12:
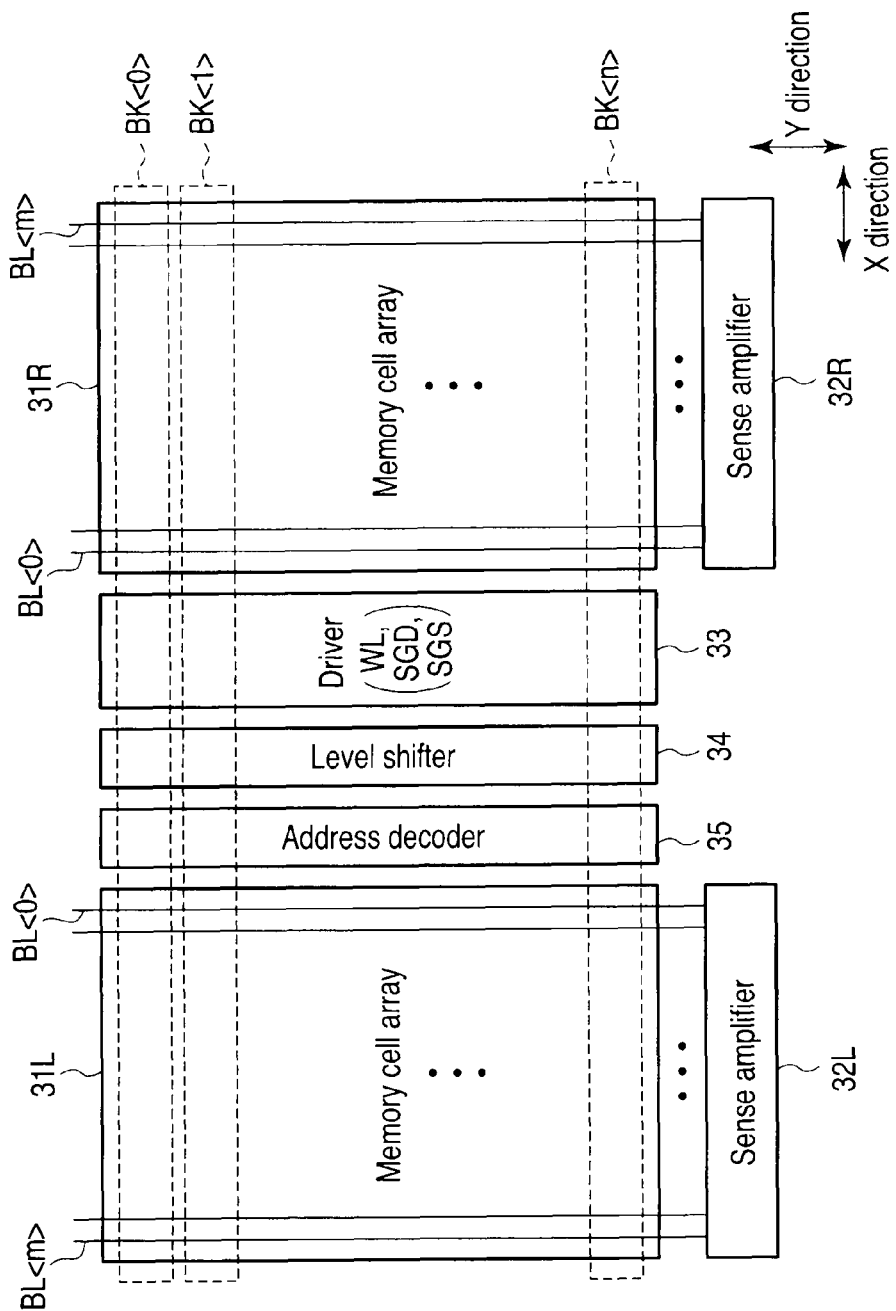
FIG. 12 is a view showing a fourth example of the block layout.

FIG. 12 shows a fourth example of the block layout of the BiCS memory.

A feature of the fourth example resides in that a driver 33 for driving a word line WL, a select gate line SGS on a source line side, and a select gate line SGD on a bit line side is shared by two memory cell arrays 31L and 3IR in comparison with the third example.

The driver 33 can be shared by reducing the area thereof, i.e., by reducing the number of transistors constituting the driver 33. More specifically, this is because a layout of wirings for connecting the memory cell arrays 31L and 31R to the drivers 33L and 33R is not made complex by reducing the number of the transistors. Although the number of the transistors constituting the driver 33 is reduced by a layout of the select gate line on the bit line side according to the present invention, this will be described later and only the block layout will be explained here.

The memory cell arrays 31L and 31R are disposed in the X-direction side by side. The driver 33, a level shifter 34, and an address decoder 35 are interposed between the memory cell arrays 31L and 31R. The driver 33 drives the word line WL, the select gate line SGS on the source line side and the select gate line SGD on the bit line side and includes a transfer transistor.

Further, sense amplifiers 32L and 32R are disposed on one ends of the memory cell arrays 31L and 31R in the Y-direction. Bit lines BL<0>, ..., BL<m> extending in the Y-direction are disposed on the memory cell arrays 31L and 31R and connected to the sense amplifiers 32L and 32R.

In the block layout, the driver 33, the level shifter 34, and the address decoder 35 are shared by the two memory cell arrays 31L and 31R.

Note that if the driver 33 can be shared by the two memory cell arrays 31L and 31R without making a wiring layout complex, the block layout of the fourth example will be most preferable in the first to fourth examples.

(2) Layout of Select Gate Line on Bit Line Side

Figure 13:
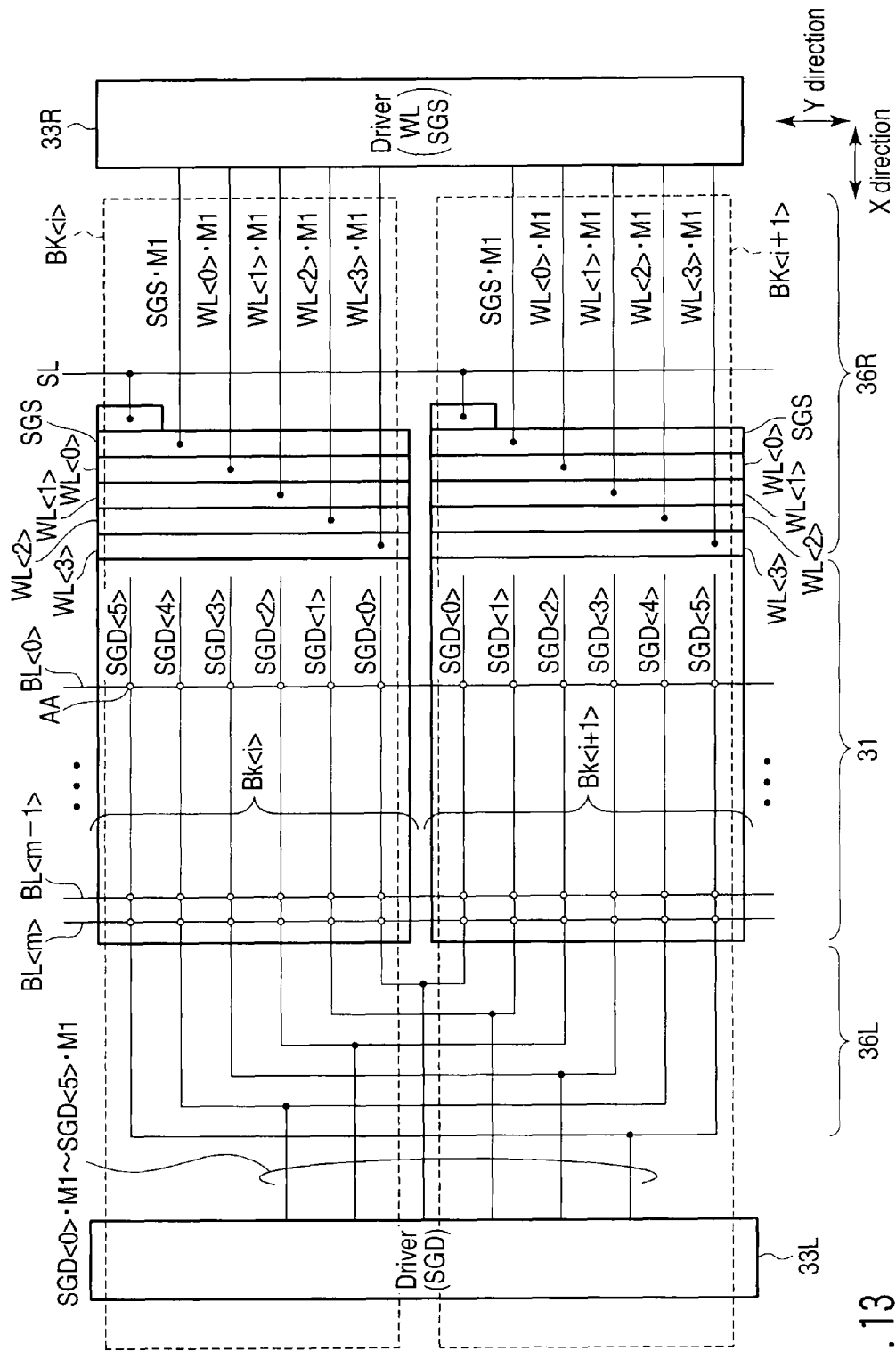
FIG. 13 is a view showing a layout of select gate lines on a bit line side.

FIG. 13 shows a first example of a layout of select gate lines on a bit line side. FIG. 14 shows a layout viewed on a plan view when the select gate lines shown in FIG. 13 are arranged as a device.

The first example corresponds to the block layout of FIG. 9. That is, a driver 33L connected to select gate lines SGD<0>, ..., SGD<5> on a bit line side is disposed on one end (left side) of a memory cell array 31 in the X-direction as well as disposed independently of a driver 33R connected to word lines WL<0>, ..., WL<3> and to a select gate line SGS on a source line side.

Each of two blocks BK<i>, BK<i+1> is comprised of at least three conductive layers, which are insulated from each other and stacked on a semiconductor substrate, bit lines BL<0>, ..., BL<m>, which are insulated from the at least three conductive layers and disposed thereon, and active layers (columnar semiconductors) AA whose lower ends are connected to the semiconductor substrate, whose upper ends are connected to the bit lines BL<0>, ..., BL<m>, and which pass through the at least three conductive layers.

The uppermost layer of the at least three conductive layers is comprised of the select gate lines SGD<0>, ..., SGD<5> on the bit line side, the lowermost layer of the at least three conductive layers is the select gate line SGS on the source line side, and the remaining conductive layers excluding the uppermost and lowermost layers of the at least three conductive layers are the word lines WL<0>, ..., WL<3>.

In the first example, although the number of the select gate lines SGD<0>, ..., SGD<5> on the bit line side is six and the number of the word lines WL<0>, WL<3> is four in one block, respectively, the numbers are not limited thereto. That is, it is sufficient that the number of the select gate lines on the bit line side and the number of the word lines be at least one in the one block, respectively.

Further, the remaining conductive layers excluding the uppermost layer of the at least three conductive layers have a plate shape whose width in the Y-direction is larger than that in the Y-direction of the select gate lines SGD<0>, ..., SGD<5> on the bit line side.

Select gate transistors on the bit line side are comprised of the select gate lines SGD<0>, ..., SGD<5> on the bit line side and the active layers AA, and select gate transistors on the source line side are comprised of the select gate line SGS on the source line side and the active layers AA. Further, memory cells are comprised of the word lines WL<0>, ..., WL<3> and the active layers AA.

Further, the region between the memory cell array 31 and the driver 33L is arranged as an interconnect portion 36L in which interconnect lines (conductive wires) SGD<0>·M1, ..., SGD<5>·M1 are disposed to connect the memory cell array 31 to the driver 33L. Likewise, the region between the memory cell array 31 and the driver 33R is arranged as an interconnect portion 36R in which interconnect lines (conductive wires) WL<0>·M1, ..., WL<3>·M1, and SGSM1 are disposed to connect the memory cell array 31 to the driver 33R.

The select gate lines SGD<0>, ..., SGD<5> on the bit line side in the block BK<i> and the select gate lines SGD<0>, ..., SGD<5> on the bit line side in the block BK<i+1> are connected to the driver 33L after they are commonly connected in the relation of one to one in one end in the X-direction of the memory cell array 31.

Specifically, an i-th (i is a natural number) select gate line on the bit line side from the block BK<i+1> side of the select gate lines SGD<0>, ..., SGD<5> on the bit line side in the block BK<i> is commonly connected to an i-th select gate line on the bit line side from the block BK<i> side of the select gate lines SGD<0>, ..., SGD<5> on the bit line side in the block BK<i+1>.

Accordingly, the select gate line s SGD<0>, ..., SGD<5> on the bit line side have a folded layout in their entirety.

The folded layout can be easily formed by making use of, for example, a side wall masking technology for etching a ground layer using a side wall as a mask.

Figure 16:
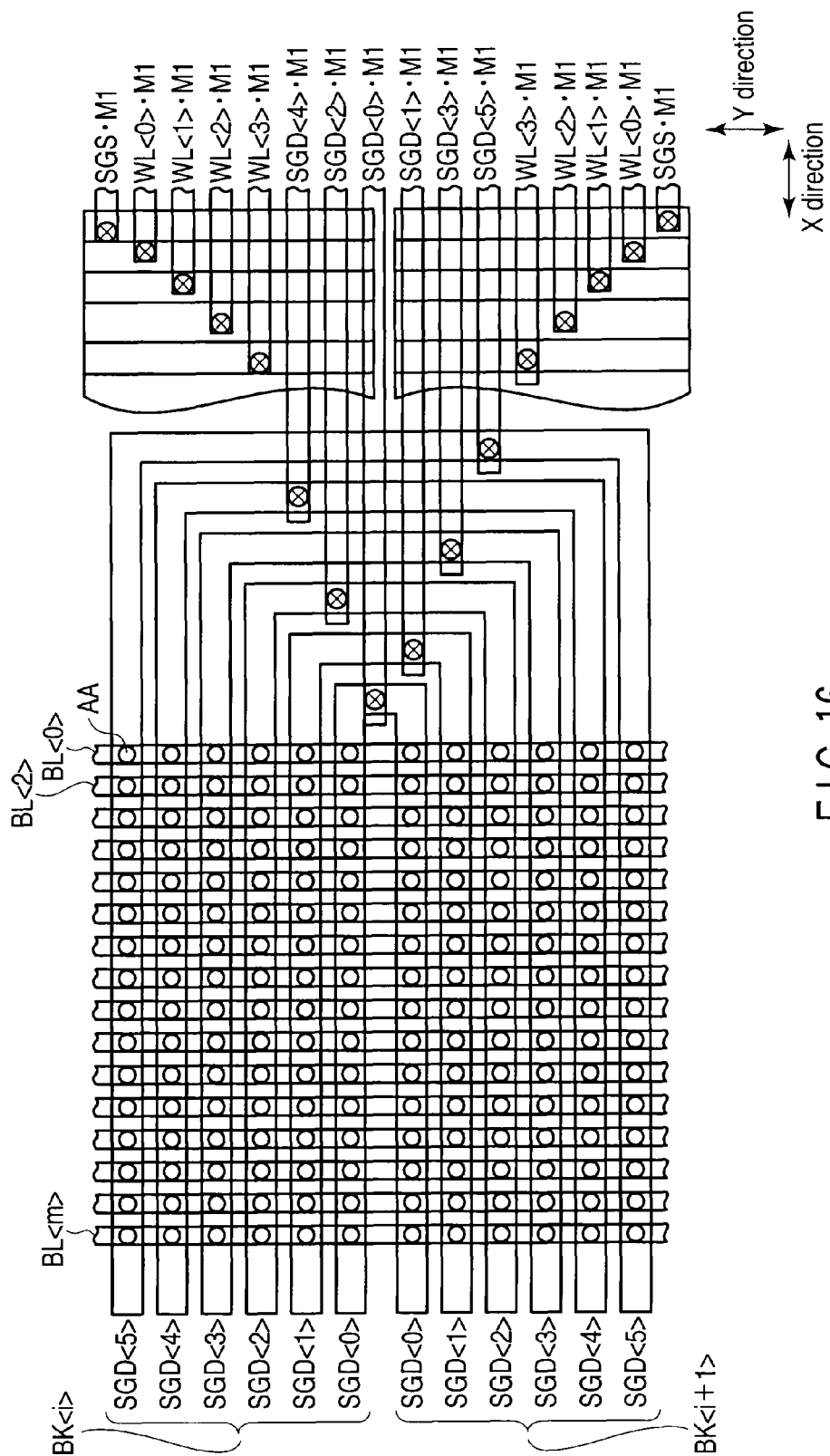
FIG. 16 is a plan view when the select gate lines shown in FIG. 15 are arranged as a device.

FIG. 15 shows a second example of a layout of select gate lines on a bit line side. FIG. 16 shows a layout viewed on a plan view when the select gate lines shown in FIG. 15 are arranged as a device.

The second example corresponds to the block layout of FIGS. 10 to 12. That is, a driver 33 (33L and 33R) disposed on one end (right side) of a memory cell array 31 in the X-direction is connected to word lines WL<0>, ..., WL<3>, a select gate line SGS on a source line side, and select gate lines SGD<0> ..., SGD<5> on a bit line side.

Attention must be paid to the fact that the portions, to which the layouts of FIGS. 15 and 16 are applied as they are, are limited to the portion between the memory cell array 31L and the driver 33L of FIG. 11 and to the portion between the memory cell array 31L and the driver 33 of FIG. 12.

The layouts, which are obtained by reversing the layouts of FIGS. 15 and 16 in a right to left direction, are applied to the remaining portions between the memory cell array 31 and the driver 33 of FIG. 10, between the memory cell array 31R and the driver 33R of FIG. 11, and between the memory cell array 31R and the driver 33 of FIG. 12.

Each of two blocks BK<i>, BK<i+1> is comprised of at least three conductive layers, which are insulated from each other and stacked on a semiconductor substrate, bit lines BL<0>, ..., BL<m>, which are insulated from the at least three conductive layers and disposed thereon, and active layers (columnar semiconductors) AA whose lower ends are connected to the semiconductor substrate, whose upper ends are connected to the bit lines BL<0>, ..., BL<m>, and which pass through the at least three conductive layers.

The uppermost layer of the at least three conductive layers is comprised of the select gate lines SGD<0>, ..., SGD<5> on the bit line side, the lowermost layer of the at least three conductive layers is a select gate line SGS on the source line side, and the remaining conductive layers excluding the uppermost and lowermost layers of the at least three conductive layers are the word lines WL<0>, ..., WL<3>.

In the second example, although the number of the select gate lines SGD<0>, ..., SGD<5> on the bit line side is six and the number of the word lines WL<0>, ..., WL<3> is four in one block, respectively, the numbers are not limited thereto. That is, it is sufficient that the number of the select gate lines on the bit line side and the number of the word lines be at least one in the one block, respectively.

Further, the remaining conductive layers excluding the uppermost layer of the at least three conductive layers have a plate shape whose width in the Y-direction is larger than the width in the Y-direction of the select gate lines SGD<0>, ..., SGD<5> on the bit line side.

Select gate transistors on the bit line side are comprised of the select gate lines SGD<0>, ..., SGD<5> on the bit line side and the active layers AA, and select gate transistors on the source line side are comprised of the select gate line SGS on the source line side and the active layers AA. Further, memory cells are comprised of the word lines WL<0>, ..., WL<3> and the active layers AA.

Further, the region between the memory cell array 31 (31L and 31R) and the driver 33L (33L and 33R) is arranged as an interconnect portion 36 in which interconnect lines (conductive wires) WL<0>·M1, WL<3>·M1, SGS·M1, SGD<0>·M1, ..., SGD<5>·M1 are disposed to connect the memory cell array 31 to the driver 33.

The select gate lines SGD<0>, ..., SGD<5> on the bit line side in the block BK<i> and the select gate lines SGD<0>, ..., SGD<5> on the bit line side in the block BK<i+1> are connected to the driver 33 (33L and 33R) after they are commonly connected in the relation of one to one in one end in the X-direction (right side) of the memory cell array 31.

Specifically, an i-th (i is a natural number) select gate line on the bit line side from the block BK<i+1> side of the select gate lines SGD<0>, ..., SGD<5> on the bit line side in the block BK<i> is commonly connected to an i-th select gate line on the bit line side from the block BK<i> side of the select gate lines SGD<0>, ..., SGD<5> on the bit line side in the block BK<i+1>.

Accordingly, the select gate lines SGD<0>, ..., SGD<5> on the bit line side have a folded layout in their entirety.

The folded layout can be easily formed by making use of, for example, a side wall masking technology for etching a ground layer using a side wall as a mask.

Figure 17:
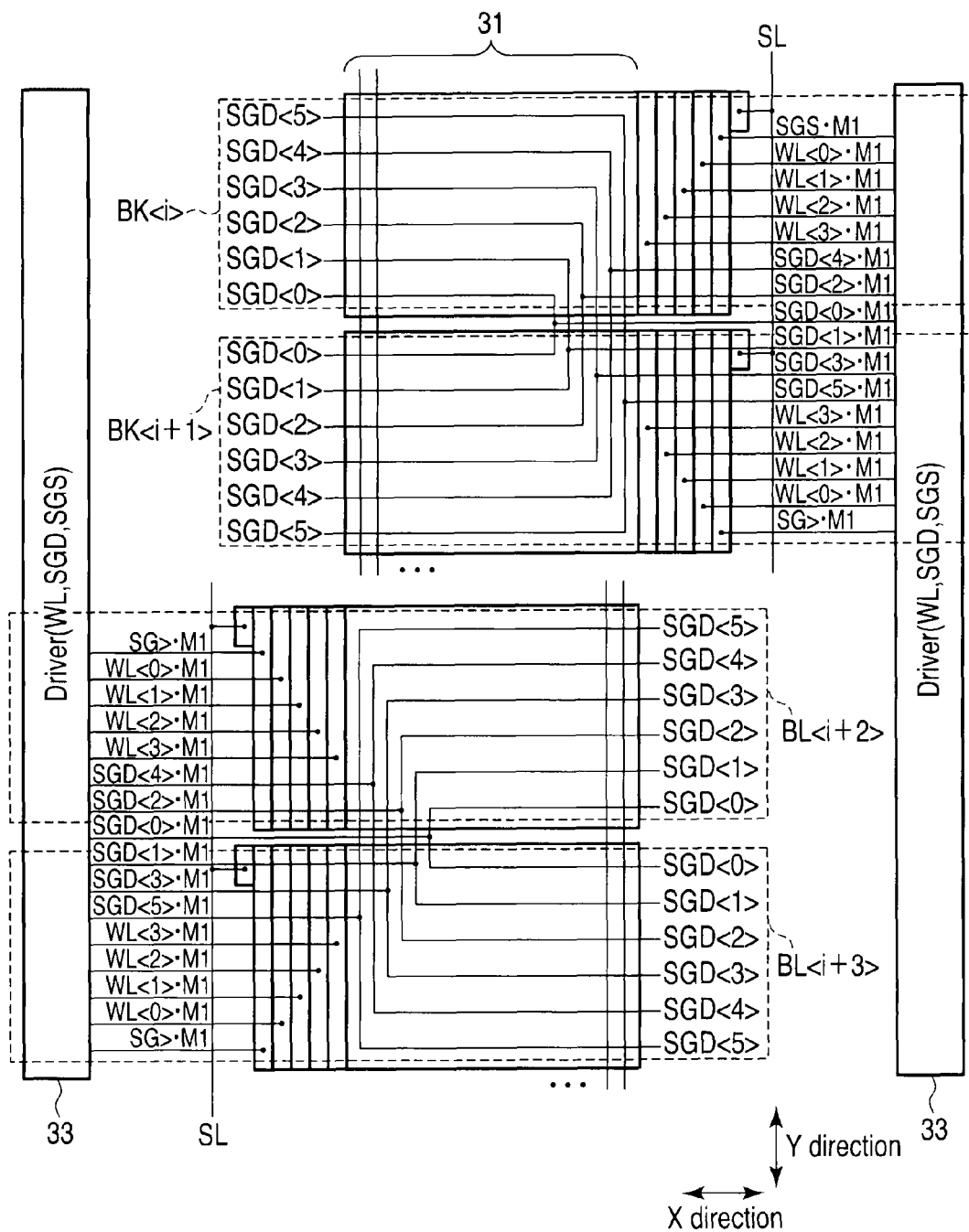
FIG. 17 is a view showing a layout of select gate lines on a bit line side.

FIG. 17 shows a layout in which drivers are disposed on both the sides of a memory cell array.

As shown in FIG. 17, when the drivers 33 are disposed on both the sides of the memory cell array 31, the size of the drivers 33 in the Y-direction per, for example, one block can be increased (the number of transistors can be increased). As a result, since the size of the drivers 33 in the X-direction can be decreased (the number of transistors can be decreased), the layout of interconnect lines (conductive wires) WL<0>·M1, ..., WL<3>·M1, SGS·M1, SGD<0>·M1, ..., SGD<5>·M1 in an interconnect portion 36 is further simplified.

Note that whether the drivers 33 (33L and 33R) are disposed on one sides of the memory cell arrays 31 (31L and 31R) as shown in FIGS. 10 to 12 or the drivers 33 are disposed on both the sides of the memory cell array 31 as shown in FIG. 17 is determined in consideration of the specification of the BiCS memory (chip), the area efficiency of the peripheral circuit, and the like.

(3) Example of Driver Circuit

An example of a driver circuit will be explained using a BiCS-NAND flash memory as an example.

FIG. 18 shows the example of the driver circuit.

It is assumed that each of memory cell arrays is arranged such that four word lines are disposed in one block (four layers), eight select gate lines (one layer) are disposed on a bit line side, and one select gate line (one layer) is disposed on a source line side.

A driver 33 is comprised of a transfer transistor (high voltage transistor) to which a high voltage is applied. Each of row decoders 35 is comprised of an AND circuit and decodes an address signal ADDRESS. Level shifters 34 are connected between the driver 33 and the row decoders 35.

BSTON, VRDEC, RDECANDn<0>, and RDECANDn<1> are control signals for turning on and off transfer transistors, and SGD<7:0>, CGi<3:0>, CG(i+1)<3:0>, SGSi, SGS(i+1), VRDEC2, and SGDS are transfer voltages.

(4) Read Disturb and Read Method

A. Read Disturb

First, read disturb specific to a BiCS memory will be explained using a BiCS-NAND flash memory as an example.

Figure 19:
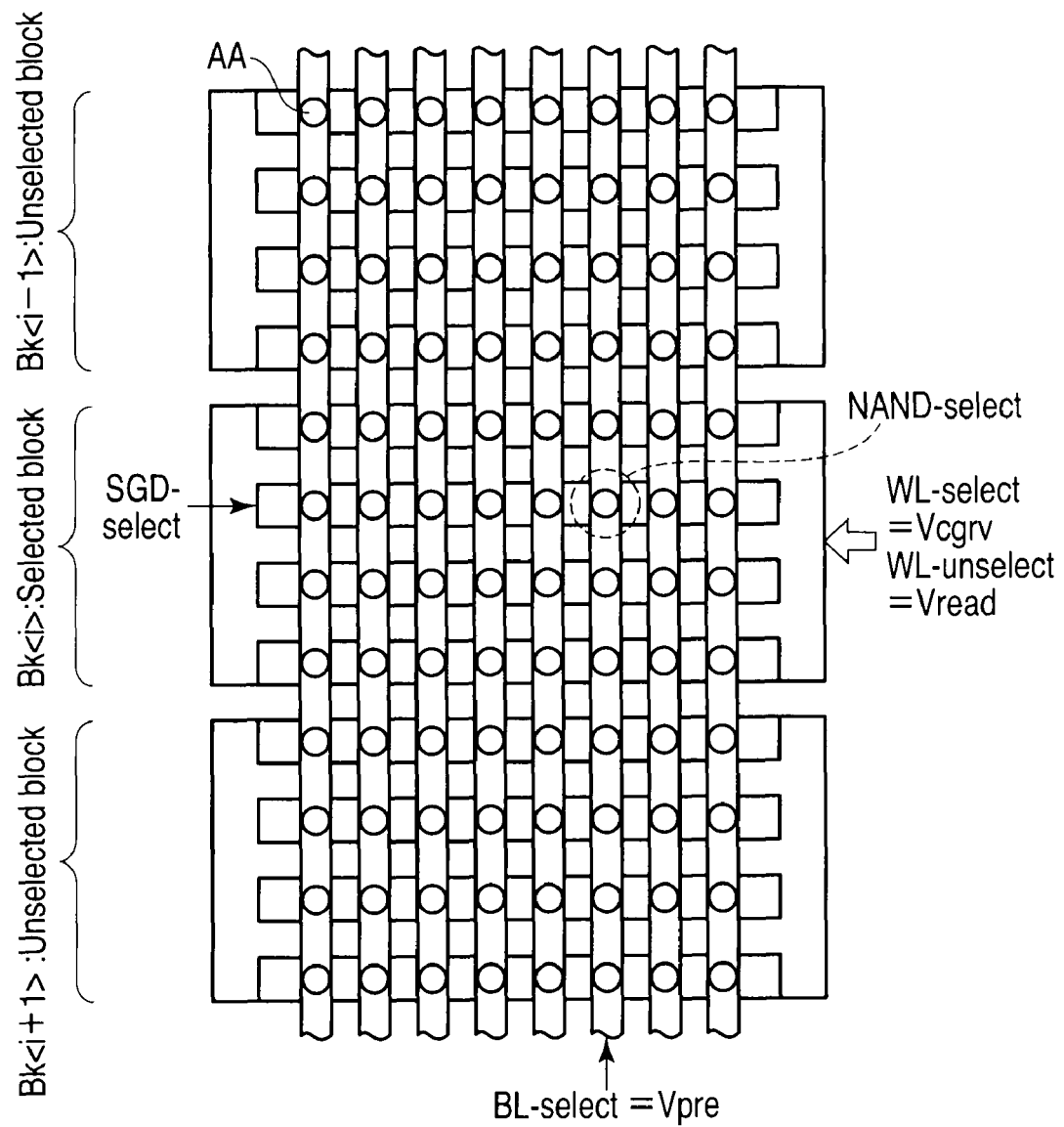
FIG. 19 is a view explaining read disturb of a BiCS memory.

FIG. 19 shows three blocks.

It is assumed that a block BK<i> is a selected block and blocks BK<i−1> and BK<i+1> are non-selected blocks.

The selected block BK<i> has a selected NAND cell unit NAND-select including a memory cell to be read. The NAND cell unit NAND-select is located at the intersection point where a selected bit line BL-select and a selected select gate line SGD-select on the bit line side intersect with each other.

In a read operation, a read potential Vcgrv is applied to a selected word line WL-select in the selected block BK<i>, and a transfer potential Vread higher than the read potential Vcgrv is applied to non-selected word lines WL-unselect in the selected block BK<i>. The read potential Vcgrv is a potential for turning on or off the memory cell depending on the state of a threshold value of the memory cell, and the transfer potential Vread is a potential for turning on the memory cell without depending on the state of the threshold value of the memory cell.

Since the NAND cell units in the block BK<i> share the word lines, the read potential Vcgrv and the transfer potential Vread are applied also to the non-selected NAND cell units other than the selected NAND cell unit in the block BK<i>.

Figure 20:
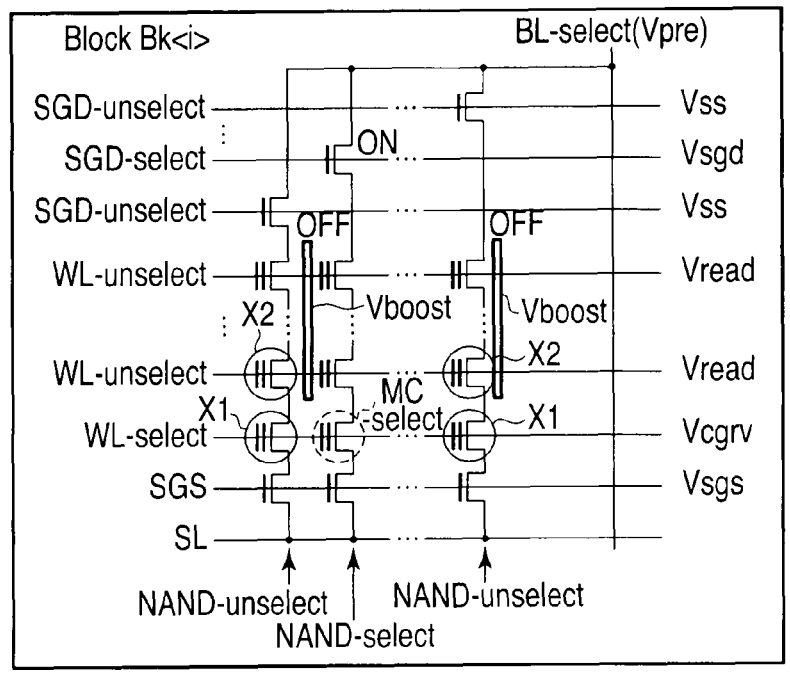
FIG. 20 is a view explaining read disturb of the BiCS memory.

When the read operation is performed, the relation of the potentials in the block BK<i> is as shown in FIG. 20.

The read potential Vcgrv is applied to the selected word line WL-select, and the transfer potential Vread is applied to the non-selected word lines WL-unselect. Further, Vsgd (for example, about 4V) is applied to a selected select gate line SGD-select on the bit line side as a potential for turning on select gate transistors on the bit line side, and Vss (for example, 0V) is applied to non-selected select gate lines SGD-unselect on the bit line side as a potential for turning off the select gate transistors on the bit line side. Further, Vsgs (for example, about 4V) is applied to a select gate line SGS on the source line side as a potential for turning on select gate transistors on the source line side.

Since the selected bit line BL-select is previously precharged with a precharge potential Vpre, the potential of the selected bit line BL-select is varied depending on the state of a threshold value of a selected memory cell MC-select. The data of the selected memory cell MC-select is determined by detecting the variation by a sense amplifier.

At this time, read disturb is liable to occur particularly in a memory cell X2 located adjacent to the bit line BL-select side of a non-selected memory cell X1 connected to the word line WL-select to which the read potential Vcgrv is applied.

B. Conventional Read Method (Reference Example)

Occurrence of read disturb will be specifically explained.

Figure 21:
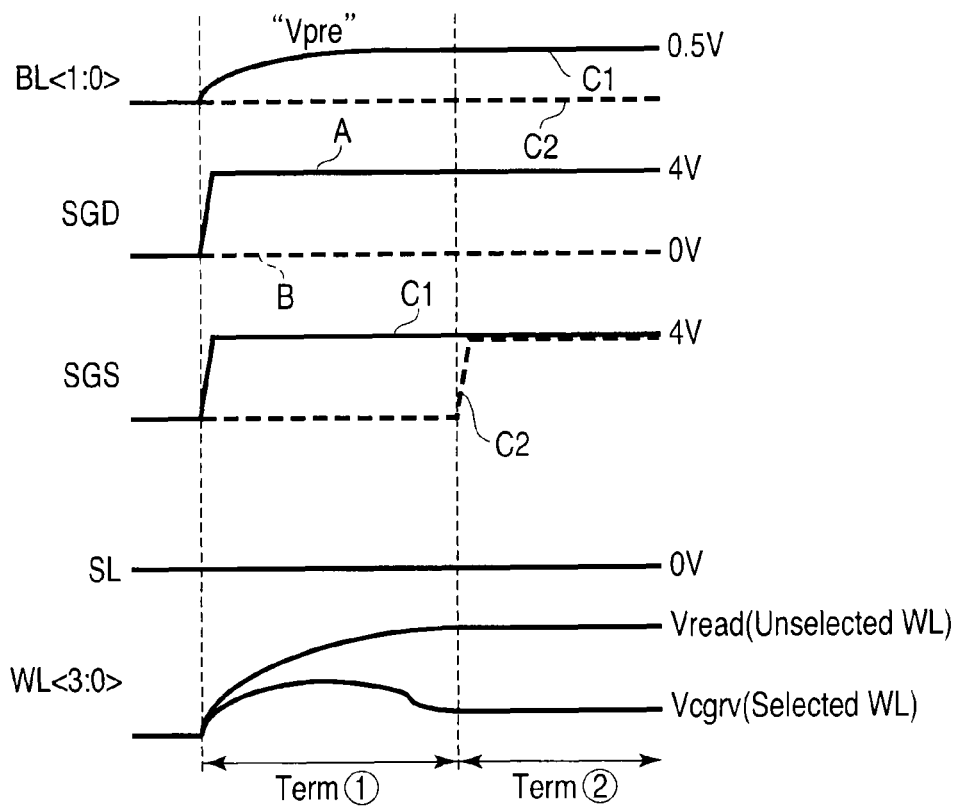
FIG. 21 is a timing view showing a read method as a reference example.
Figure 22:
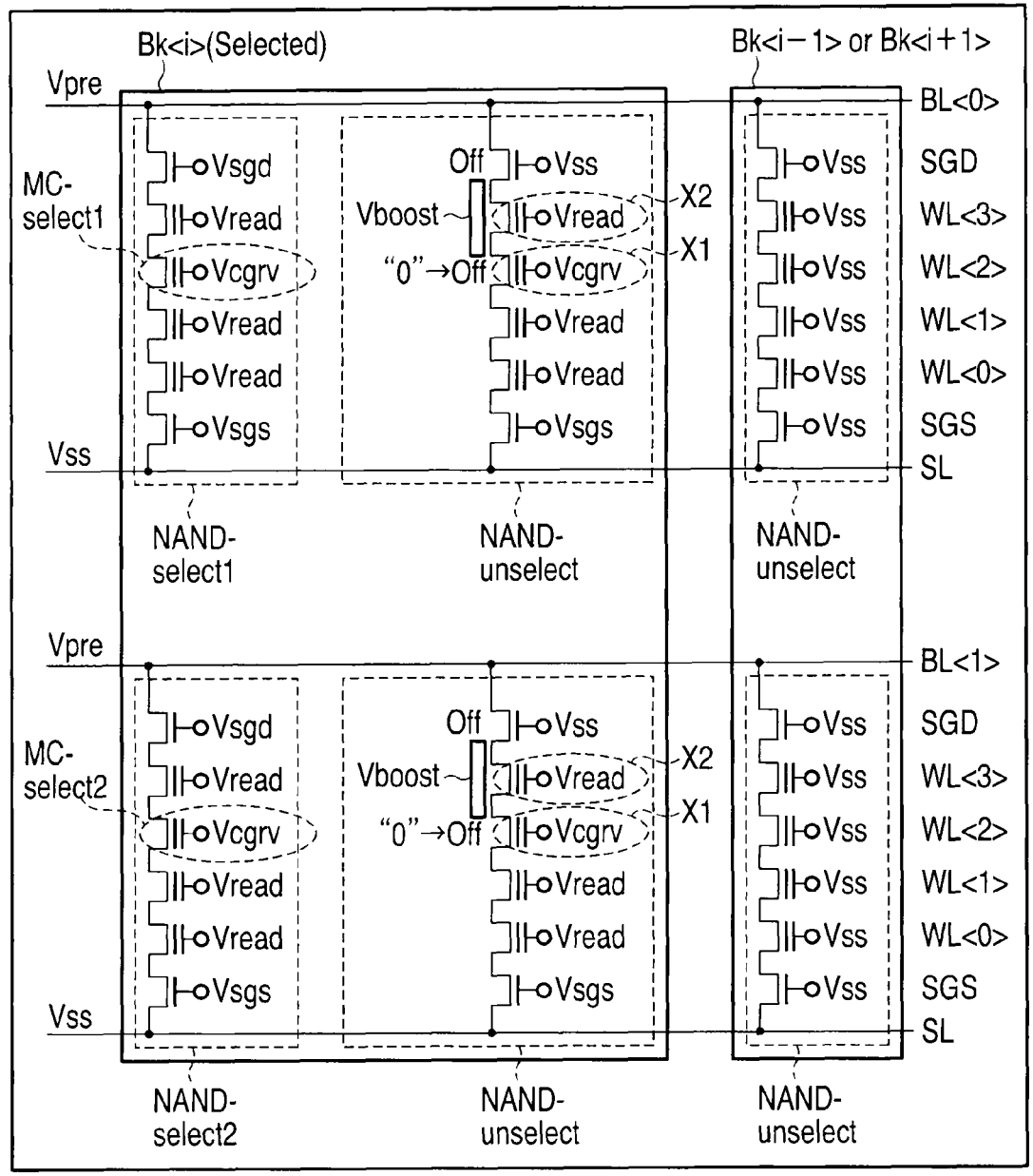
FIG. 22 is a view showing the relation of potentials of the reference example.
Figure 23:
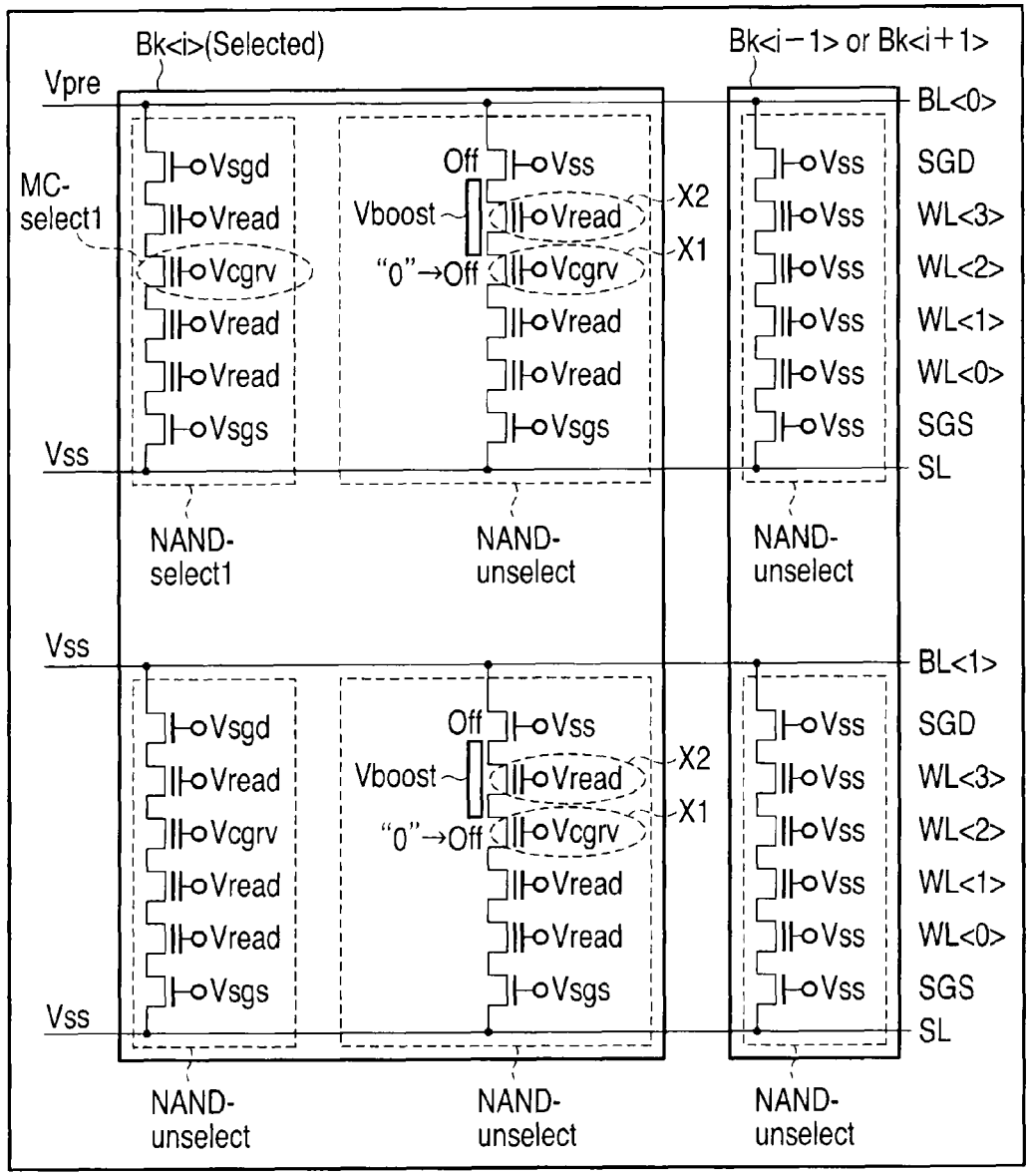
FIG. 23 is a view showing the relation of potentials of the reference example.

FIG. 21 is a timing chart showing a conventional read method. FIGS. 22 and 23 show the relation of potentials in read.

First, in a selected block BK<i>, a read potential Vcgrv is applied to selected word lines WL<2>, and a transfer potential Vread is applied to non-selected word lines WL<0>, WL<1>, WL<3>. Further, a potential Vsgd (for example, 4V) is applied to select gate lines SGD on bit line sides in selected NAND cell units NAND-select1 and NAND-select2 to turn on select gate transistors on the bit line sides (solid line A), and a potential Vss (for example, 0V) is applied to select gate lines SGD on the bit line sides in non-selected NAND cell units NAND-unselect to turn off the select gate transistors on the bit line sides (broken line B). Further, the ground potential Vss is applied to source lines SL.

When the ABL (All Bit Line) sense system is employed, a precharge potential Vpre is applied to all the bit lines BL<0> and BL<1> as shown in FIG. 22, and a potential Vsgs is applied to select gate lines SGS on the source line sides to turn on select gate transistors on the source line sides (solid line C1 of FIG. 21). In contrast, when a sealed bit line sense system is employed, as shown in FIG. 23, the potential Vsgs is applied after the precharge potential Vpre is applied to selected bit lines BL<0>, the sealed potential Vss (for example, 0V) is applied to non-selected bit lines BL<1>, the potential Vsgs is applied to selected select gate lines SGS on the source line sides to turn on the select gate transistors on the source line sides, and the potential Vss is applied to non-selected select gate lines SGS on the source line sides to turn off the select gate transistors on the source line sides (broken line C2 of FIG. 21).

As to non-selected blocks BK<i−1>, BK<i+1>, the relation of potentials is as shown in FIGS. 22 and 23.

At this time, the select gate transistors on the bit line side are turned off in the non-selected NAND cell units NAND-unselect in the selected block BK<i> and cut off from the bit lines in read. Further, when a non-selected memory cell X1, to which the read potential Vcgrv is applied, in the non-selected cell units NAND-unselect, is in a high threshold value state, i.e., for example, a "0" state of a binary value ("0"/"1") stored therein, the non-selected memory cell X1 is turned off before and after the read potential Vcgrv is applied thereto.

Accordingly, the channel of a memory cell X2 existing nearer to the bit line side than the memory cell X1, to which the read potential Vcgrv is applied, in the non-selected cell unit NAND-unselect, is in a floating state as well as the channel thereof is boosted by capacitance coupling when the read potential Vcgrv is applied (Vboost).

In contrast, in a BiCS memory, the ground potential Vss is transferred from the source line SL to the channel of a memory cell existing nearer to the source line side than the memory cell X1, to which the read potential Vcgrv is applied, in the non-selected NAND cell unit NAND-unselect in the read operation.

Accordingly, since a large potential difference is generated between a source and a drain of the memory cell X1, to which the read potential Vcgrv is applied, in the non-selected NAND cell unit NAND-unselect, punch-through is caused between the source and the drain of the memory cell X1.

A hot carrier is generated by the punch-through and injected into a charge accumulation layer of the memory cell X2 existing nearer to the bit lines BL<0>,BL<1> side than the memory cell X1, to which the read potential Vcgrv is applied, in the non-selected NAND cell unit NAND-unselect, and a threshold voltage is varied thereby.

Figure 24:
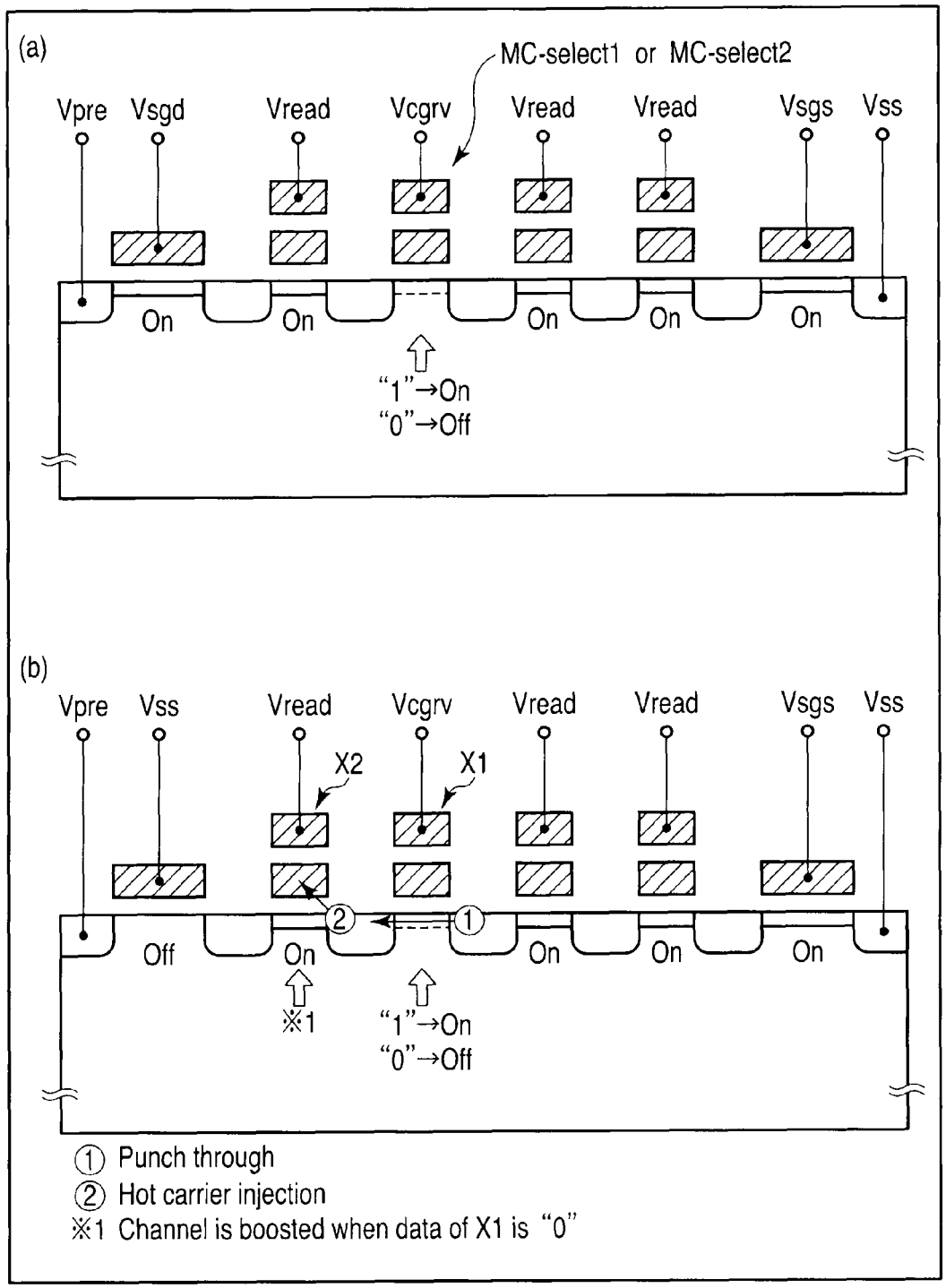
FIG. 24 is a view showing how read disturb occurs.

FIG. 24 shows a state when read disturb occurs.

FIG. 24(a) shows a NAND cell unit including selected memory cells MC-select1 and MC-select2, and FIG. 24(b) shows a NAND cell unit including only non-selected memory cells. In FIG. 24(b), memory cells X1, X2 correspond to the memory cells X1, X2 of FIGS. 22 and 23.

C. Read Method according to Example of Present Invention

To prevent the read disturb described above, it is only necessary to set operation timing at which generation of a large potential difference is prevented between the source and the drain of the memory cell, to which the read potential is applied, in the non-selected cell unit.

Figure 26:
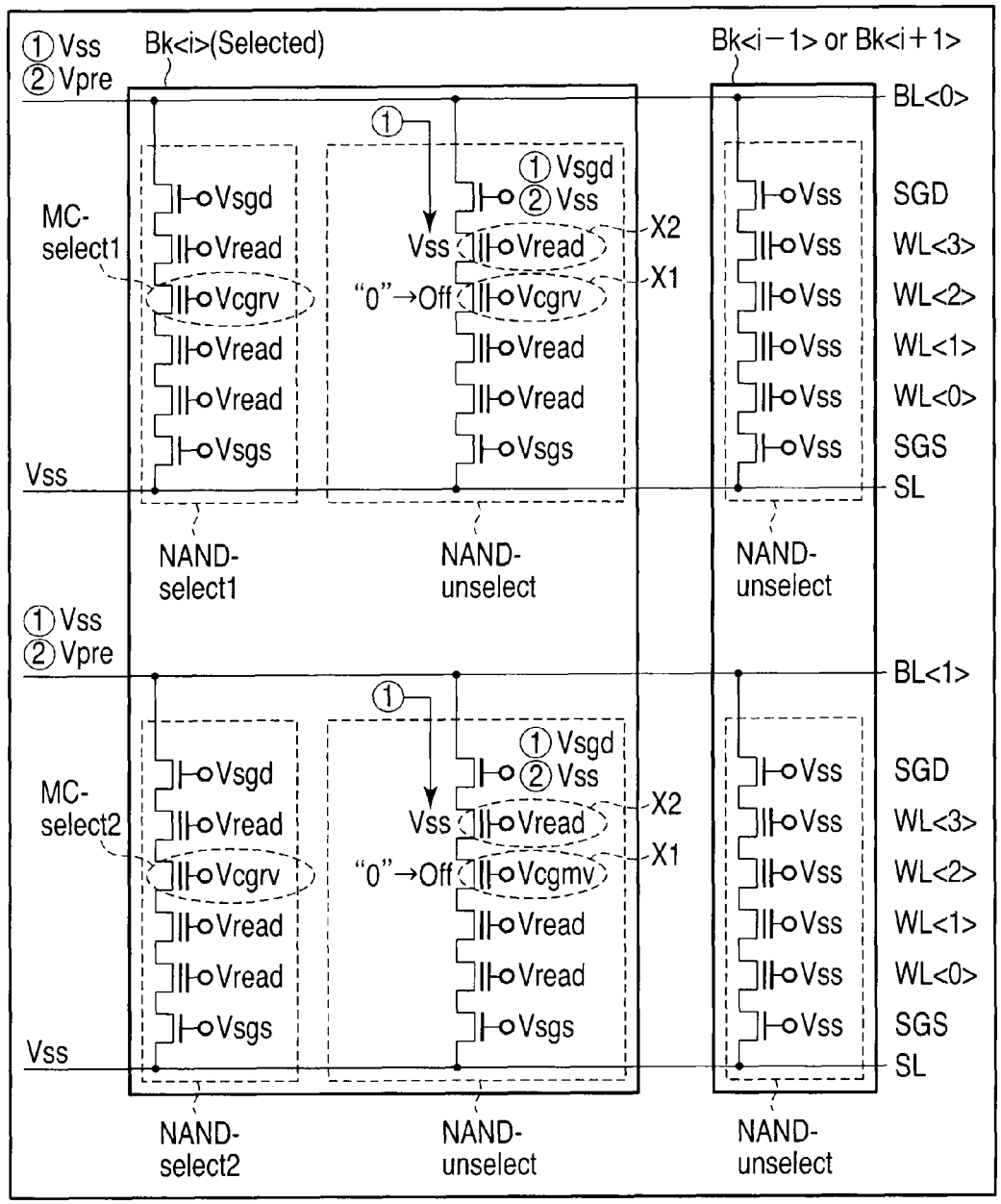
FIG. 26 is a view showing the relation of potentials according to an example of the present invention.
Figure 27:
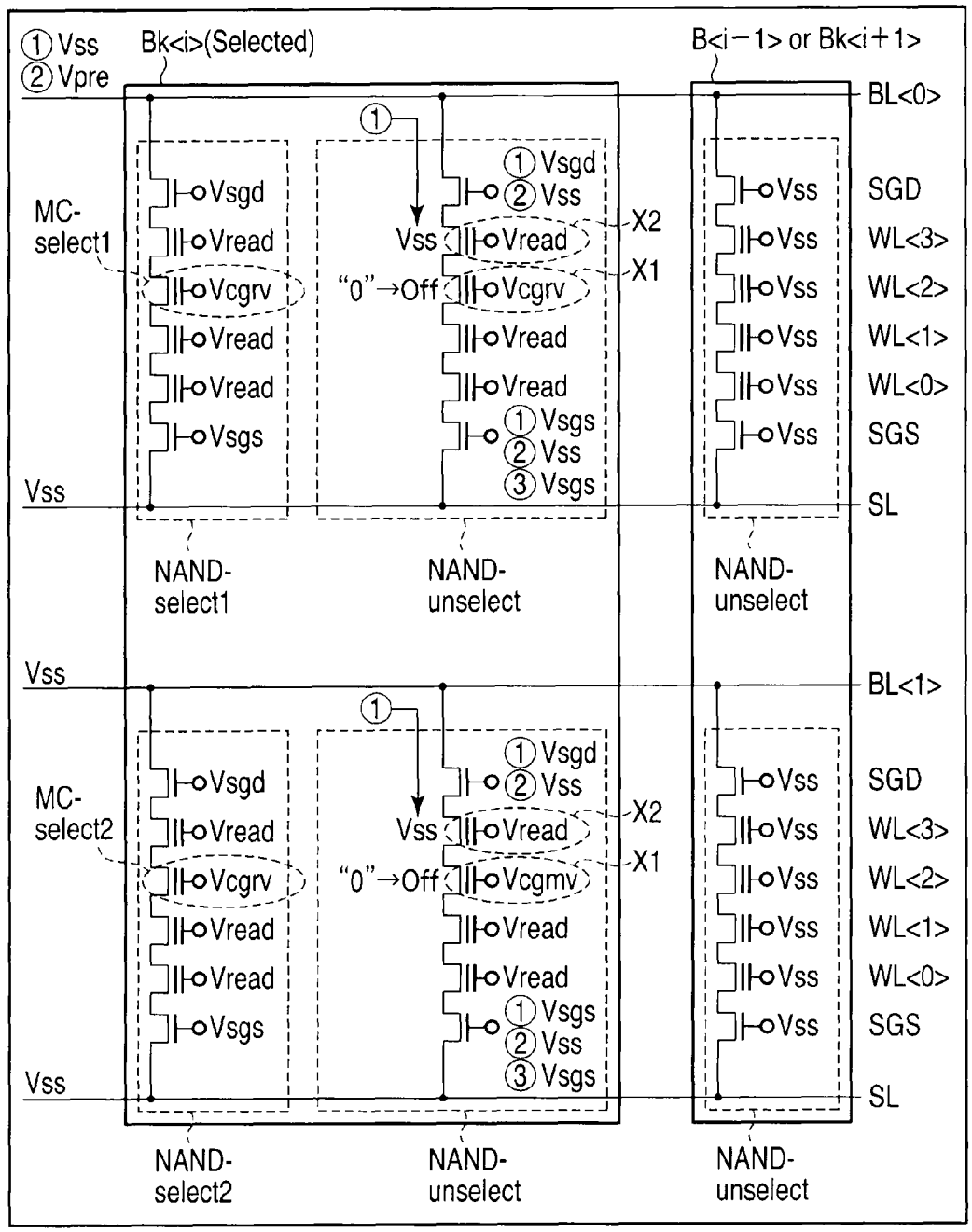
FIG. 27 is a view showing the relation of potentials according to an example of the present invention.

FIG. 25 is a timing chart showing a read method according to the example of the present invention. FIGS. 26 and 27 show the relation of potentials in read.

Period 1

In a selected block BK<i>, a read potential Vcgrv is applied to a selected word line WL<2>, and a transfer potential Vread is applied to non-selected word lines WL<0>, WL<1>, WL<3>. Further, a potential Vsgd (for example, 4V) is applied to all the select gate lines SGD on bit line sides to turn on select gate transistors on the bit line sides, a potential Vsgs (for example, 4V) is applied to all the select gate lines SGS on source line sides to turn on select gate transistors on the source line sides, and a ground potential Vss is applied to all the bit lines BL<0>, BL<1>, and the source lines SL.

The read method according to the example of the present invention is different from the conventional read method in that the read potential Vcgrv or the transfer potential Vread is applied to the word lines WL<0>, WL<1>, WL<2>, WL<3> in the selected block BK<i> in a state that the ground potential Vss is applied to a channel of a memory cell X2 existing nearer to the bit lines BL<0>, BL<1> side than a memory cell X1, to which the read potential Vcgrv is applied, in the non-selected NAND cell unit NAND-unselect in the selected block BK<i>.

In this case, when the read potential Vcgrv or the transfer potential Vread is applied to the word lines WL<0>, WL<1>, WL<2>, and WL<3> in the selected block BK<i>, the channel of the memory cell X2 in the non-selected NAND cell unit NAND-unselect is fixed to the ground potential Vss, and thus the channel of the memory cell X2 is not boosted.

Periods 2 to 3

The potential Vsgd (for example, 4V) is applied to the select gate lines SGD on the bit line sides in selected NAND cell units NAND-select1 and NAND-select2 to turn on the select gate transistors on the bit line sides (solid line A), and the potential Vss (for example, 0V) is applied to the select gate lines SGD on the bit line sides in the non-selected NAND cell units NAND-unselect to turn off the select gate transistors on the bit line sides (broken line B). Further, the ground potential Vss is applied to the source lines SL.

When the ABL (All Bit Line) sense system is employed, a precharge potential Vpre is applied to all the bit lines BL<0> and BL<1> as shown in FIG. 26, and the potential Vsgs (for example, 4V) is applied to the select gate lines SGS on the source line sides to turn on select gate transistors on the source line sides (solid line C1 of FIG. 25). In contrast, when the sealed bit line sense system is employed, the potential Vsgs is applied after the precharge potential Vpre is applied to the bit line BL<0> selected as shown in FIG. 27, the sealed potential Vss (for example, 0V) is applied to the non-selected bit line BL<1>, the potential Vsgs is applied to the selected select gate lines SGS on the source line sides to turn on the select gate transistors on the source line sides, and the potential Vss is applied to the non-selected select gate lines SGS on the source line sides to turn off the select gate transistors on the source line sides (broken line C2 of FIG. 25).

As to non-selected blocks BK<i−1>, BK<i+1>, the relation of potentials is as shown in FIGS. 26 and 27.

At this time, the select gate transistors on the bit line sides are turned off in the non-selected NAND cell units NAND-unselect in the selected block BK<i> and cut off from the bit lines in read. Further, when a non-selected memory cell X1, to which the read potential Vcgrv is applied, in the non-selected NAND cell units NAND-unselect, is in a high threshold value state, i.e., for example, a "0" state of a binary value ("0"/"1") stored therein, the non-selected memory cell X1 is turned off.

Accordingly, the channel of the memory cell X2 existing nearer to the bit line side than the memory cell X1, to which the read potential Vcgrv is applied, in the non-selected NAND cell unit NAND-unselect is in a floating state.

However, since the read potential Vcgrv and the transfer potential Vread are already applied to the selected block BK<i> in the period 1, the channel of the memory cell X2 is not boosted by capacitance coupling.

Accordingly, even if the ground potential Vss is transferred from the source line SL to the channel of the memory cell existing nearer to the source line side than the memory cell X1 in the non-selected NAND cell unit NAND-unselect, no large potential difference is generated between the source and the drain of the memory cell X1. As a result, variation of a threshold voltage (read disturb) of the memory cell X2 is prevented.

Figure 28:
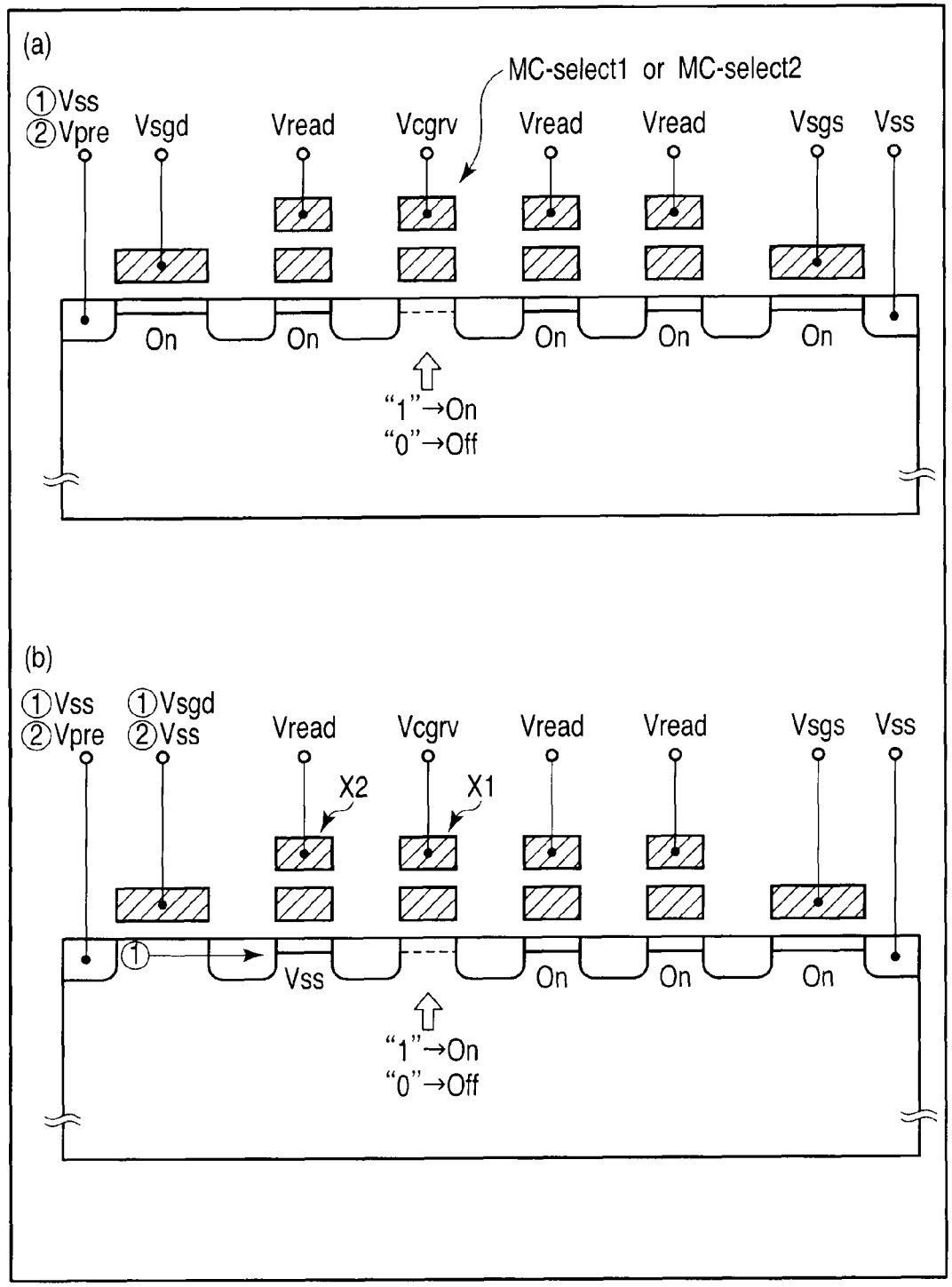
FIG. 28 is a view showing how read disturb is improved.

FIG. 28 shows states when the read potential and the transfer potential are applied.

FIG. 28(a) shows a NAND cell unit including selected memory cells MC-select1 and MC-select2, and FIG. 28(b) shows a NAND cell unit including only non-selected memory cells. In FIG. 28(b), memory cells X1, X2 correspond to the memory cells X1, X2 of FIGS. 26 and 27, and numerals in circles 1 to 3 correspond to the periods 1 to 3 of FIG. 25.

As apparent from FIG. 28(b), when the read potential Vcgrv or the transfer potential Vread is applied to the word lines WL<0>, WL<1>, WL<2>, and WL<3> in the selected block BK<i>, the channel of the memory cell X2 in the non-selected NAND cell unit NAND-unselect is fixed to the ground potential Vss, and thus the channel of the memory cell X2 is not boosted.

D. Others

The read method according to the example of the present invention is not limited to the operation timing of FIG. 25 and is effective in the following cases.

In the period 1, the ground potential is supplied to the channel of the memory cell located nearer to the bit line side than the memory cell, to which the read potential is applied, in the non-selected NAND cell unit. However, the ground potential may be supplied from the source line in place of the above case. However, in this case, the transfer potential Vread is also applied to the selected word lines in the period 1.

It is sufficient that the read potential Vcgrv or the transfer potential Vread be applied to the word lines in the selected block before the timing at which all the memory cells in the non-selected NAND cell unit in the selected block are cut off from the bit lines.

It is sufficient that the timing at which the precharge potential Vpre is applied to the bit lines be the same timing or after the timing at which all the memory cells in the non-selected NAND cell unit in the selected block are cut off from the bit lines.

(5) Conclusion

As described above, according to the embodiment of the present invention, read disturb of a three dimensional stacked nonvolatile semiconductor memory to which a BiCS technology is applied can be improved.

4. Application Example

Although the technology of the present invention is effective for a BiCS-NAND flash memory in which one cell unit is comprised of memory cells (NAND columns) connected to each other in series to realize bit cost scalability, the technology can be also applied to a three dimensional stacked nonvolatile semiconductor memory to which the BiCS technology is applied in addition to the above BiCS-NAND flash memory.

For example, the technology of the present invention is also effective for a nonvolatile semiconductor memory which has exactly the same device structure as that of the BiCS-NAND flash memory but in which only one central memory cell of memory cells in one cell unit is used as a memory cell and the remaining memory cells are used as dummy cells as an example other than the BiCS-NAND flash memory.

Further, as to a memory cell structure of the BiCS memory, it is considered that a so-called MONOS type, in which a charge accumulation layer is comprised of an insulation material (for example, nitride), is effective, but the example of the present invention is not limited thereto and can be also applied to a floating gate type in which a charge accumulation layer is comprised of conductive polysilicon.

Further, a data value stored in one memory cell may be a binary value (two-level) or a multivalue (multi-level) of at least a ternary value (three-level).

5. Advantages

According to the present invention, read disturb of a three dimensional stacked nonvolatile semiconductor memory to which a BiCS technology is applied can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A three dimensional stacked nonvolatile semiconductor memory comprising:
a semiconductor substrate;
a memory cell array comprised of first and second blocks disposed on the semiconductor substrate side by side in a first direction; and
a first driver disposed on one end of the memory cell array in a second direction orthogonal to the first direction,
wherein each of the first and second blocks is comprised of at least three conductive layers stacked on the semiconductor substrate by being insulated from each other, a bit line disposed on the at least three conductive layers by being insulated therefrom, and columnar semiconductors having lower ends connected to the semiconductor substrate and upper ends connected to the bit line and passing through the at least three conductive layers,
wherein an uppermost layer of the at least three conductive layers is comprised of first select gate lines extending in the second direction, a lowermost layer of the at least three conductive layers is a second select gate line, remaining conductive layers excluding the uppermost layer and the lowermost layer of the at least three conductive layers are a word line, and remaining conductive layers excluding the uppermost layer of the at least three conductive layers have a plate shape whose width in the first direction is larger than the width in the first direction of the first select gate lines,
wherein select gate transistors are comprised of the first select gate lines and the columnar semiconductors, and the second select gate line and the columnar semiconductors, respectively and memory cells are comprised of the word line and the columnar semiconductors, respectively,
wherein the first block has a selected first cell unit including a memory cell to be read and a non-selected second cell unit not including a memory cell to be read,
wherein a read potential or a transfer potential higher than the read potential is applied to the word line in the first block in a state that a ground potential is applied to a channel of a memory cell existing nearer to the bit line side than a memory cell in the second cell unit to which the read potential is applied, after which all the memory cells in the second cell unit are cut off from the bit line, the bit line is set to a precharge potential, and read is performed to the memory cell to be read in the first cell unit, and wherein the read potential and the transfer potential are not applied to the word line in the second block in the read.

2. The memory according to claim 1, wherein the ground potential is transferred from the bit line to a channel of a memory cell existing nearer to the bit line side than a memory cell, to which the read potential is applied, in the second cell unit.

3. The memory according to claim 1, wherein a timing at which the read potential or the transfer potential is applied to the word line in the first block is before a timing at which all the memory cells in the second cell unit are cut off from the bit line.

4. The memory according to claim 1, wherein a timing at which the precharge potential is applied to the bit line is the same as or after a timing at which all the memory cells in the second cell unit are cut off from the bit line.

5. The memory according to claim 1, wherein even after the read potential or the transfer potential is applied to the word line in the first block, a channel of a memory cell existing nearer to the bit line side than a memory cell, to which the read potential is applied, in the second cell unit is kept to the ground potential.

6. The memory according to claim 1, wherein one end in the second direction of the at least three conductive layers is formed stepwise.

7. The memory according to claim 6, wherein one end in the second direction of each of the at least three conductive layers is connected to an interconnect line located above the at least three conductive layers through a contact plug.

8. The memory according to claim 7, wherein the interconnect line is connected to the first driver.

9. The memory according to claim 6, wherein one end in the second direction of each of the at least three conductive layers excluding the uppermost layer is connected to an interconnect line located above the at least three conductive layers through a contact plug.

10. The memory according to claim 9, wherein the interconnect line is connected to the first driver.

11. The memory according to claim 9, wherein the other end in the second direction of the uppermost layer of the at least three conductive layers is connected to an interconnect line located above the at least three conductive layers through a contact plug.

12. The memory according to claim 1, wherein the at least three conductive layers are comprised of polysilicon.

13. The memory according to claim 1, wherein the bit line is comprised of metal.

14. The memory according to claim 1, wherein the memory cell and the select gate transistor comprise a NAND cell unit.

15. A three dimensional stacked nonvolatile semiconductor memory comprising:
a semiconductor substrate; and
a memory cell array comprised of first and second blocks disposed on the semiconductor substrate;
wherein each of the first and second blocks is comprised of at least two conductive layers stacked on the semiconductor substrate by being insulated from each other, a bit line disposed on the at least two conductive layers by being insulated therefrom, and columnar semiconductors having lower ends connected to the semiconductor substrate and upper ends connected to the bit line and passing through the at least two conductive layers,
wherein the at least two conductive layers are a select gate line or a word line, a select gate transistor is comprised of the select gate line and the columnar semiconductor, and a memory cell is comprised of the word line and the columnar semiconductor, and wherein a read potential or a transfer potential higher than the read potential is applied to the word line in the first block in a state that a ground potential is applied to a channel of a memory cell existing nearer to the bit line side than a memory cell in the second cell unit to which the read potential is applied, after which all the memory cells in the second cell unit are cut off from the bit line, the bit line is set to a precharge potential, and read is performed to the memory cell to be read in the first cell unit.

16. The memory according to claim 15, wherein the ground potential is transferred from the bit line to a channel of a memory cell existing nearer to the bit line side than a memory cell, to which the read potential is applied, in the second cell unit.

17. The memory according to claim 15, wherein a timing at which the read potential or the transfer potential is applied to the word line in the first block is before a timing at which all the memory cells in the second cell unit are cut off from the bit line.

18. The memory according to claim 15, wherein a timing at which the precharge potential is applied to the bit line is the same as or after a timing at which all the memory cells in the second cell unit are cut off from the bit line.

19. The memory according to claim 15, wherein even after the read potential or the transfer potential is applied to the word line in the first block, a channel of a memory cell existing nearer to the bit line side than a memory cell, to which the read potential is applied, in the second cell unit is kept to the ground potential.

20. The memory according to claim 15, wherein each of the first and second cell units has the select gate transistor to be provided at the bit line side independently, and all the memory cells in the second cell unit are cut off from the bit line when the select gate transistor to be provided at the bit line side turns off.

* * * * *